(12) United States Patent
Lee et al.

(10) Patent No.: US 11,121,040 B2
(45) Date of Patent: Sep. 14, 2021

(54) MULTI VOLTAGE THRESHOLD TRANSISTORS THROUGH PROCESS AND DESIGN-INDUCED MULTIPLE WORK FUNCTIONS

(71) Applicant: Intel Corporation, Santa Clara, CA (US)

(72) Inventors: Chen-Guan Lee, Portland, OR (US); Everett S. Cassidy-Comfort, Beaverton, OR (US); Joodong Park, Portland, OR (US); Walid M. Hafez, Portland, OR (US); Chia-Hong Jan, Portland, OR (US); Rahul Ramaswamy, Portland, OR (US); Neville L. Dias, Hillsboro, OR (US); Hsu-Yu Chang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/317,265

(22) PCT Filed: Sep. 30, 2016

(86) PCT No.: PCT/US2016/054879
§ 371 (c)(1),
(2) Date: Jan. 11, 2019

(87) PCT Pub. No.: WO2018/063359
PCT Pub. Date: Apr. 5, 2018

(65) Prior Publication Data
US 2019/0304840 A1    Oct. 3, 2019

(51) Int. Cl.
*H01L 21/8238* (2006.01)
*H01L 27/092* (2006.01)
(Continued)

(52) U.S. Cl.
CPC .. *H01L 21/82385* (2013.01); *H01L 21/26586* (2013.01); *H01L 21/28088* (2013.01);
(Continued)

(58) Field of Classification Search
CPC ......... H01L 21/82385; H01L 21/26586; H01L 21/28088; H01L 21/31155;
(Continued)

(56) References Cited

U.S. PATENT DOCUMENTS 6,777,351 B1 * 8/2004 Hill .................. H01L 21/02129
257/E21.245
2007/0069302 A1    3/2007 Jin et al.
(Continued)

OTHER PUBLICATIONS

International Preliminary Report on Patentability for International Patent Application No. PCT/US2016/054879 dated Apr. 11, 2019, 9 pgs.
(Continued)

*Primary Examiner* — Christine A Enad
(74) *Attorney, Agent, or Firm* — Schwabe, Williamson & Wyatt, P.C.

(57) ABSTRACT

An apparatus comprising at least one transistor in a first area of a substrate and at least one transistor in a second area, a work function material on a channel region of each of the at least one transistor, wherein an amount of work function material in the first area is different than an amount of work function material in the second area. A method comprising depositing a work function material and a masking material on at least one transistor body in a first area and at least one in a second area; removing less than an entire portion of the masking material so that the portion of the work function material that is exposed in the first area is different than that exposed in the second area; removing the exposed work
(Continued)

function material; and forming a gate electrode on each of the at least one transistor bodies.

20 Claims, 24 Drawing Sheets

(51) Int. Cl.
| | |
|---|---|
| *H01L 29/423* | (2006.01) |
| *H01L 29/49* | (2006.01) |
| *H01L 21/28* | (2006.01) |
| *H01L 21/3213* | (2006.01) |
| *H01L 21/265* | (2006.01) |
| *H01L 21/3115* | (2006.01) |
| *H01L 29/66* | (2006.01) |
| *H01L 21/8234* | (2006.01) |
| *H01L 21/84* | (2006.01) |
| *H01L 27/12* | (2006.01) |
| *H01L 27/088* | (2006.01) |
| *H01L 29/10* | (2006.01) |
| *H01L 27/02* | (2006.01) |

(52) U.S. Cl.
CPC .. *H01L 21/31155* (2013.01); *H01L 21/32134* (2013.01); *H01L 21/32139* (2013.01); *H01L 21/82345* (2013.01); *H01L 21/823431* (2013.01); *H01L 21/823807* (2013.01); *H01L 21/823821* (2013.01); *H01L 21/823842* (2013.01); *H01L 21/845* (2013.01); *H01L 27/0886* (2013.01); *H01L 27/0922* (2013.01); *H01L 27/0924* (2013.01); *H01L 27/1211* (2013.01); *H01L 29/1054* (2013.01); *H01L 29/42376* (2013.01); *H01L 29/4966* (2013.01); *H01L 29/66* (2013.01); *H01L 29/6681* (2013.01); *H01L 29/66545* (2013.01); *H01L 21/823437* (2013.01); *H01L 21/823456* (2013.01); *H01L 27/0207* (2013.01)

(58) Field of Classification Search
CPC ......... H01L 21/32134; H01L 21/32139; H01L 21/823431; H01L 21/82345; H01L 21/823807; H01L 21/823821; H01L 21/823842; H01L 21/845; H01L 27/0886; H01L 27/0922; H01L 27/0924; H01L 27/1211; H01L 29/1054; H01L 29/42376; H01L 29/4966; H01L 29/66; H01L 29/66545; H01L 29/6681
See application file for complete search history.

(56) References Cited

U.S. PATENT DOCUMENTS

| | | | |
|---|---|---|---|
| 2008/0303096 | A1 | 12/2008 | Schulz |
| 2012/0199909 | A1 | 8/2012 | Schulz et al. |
| 2014/0038402 | A1 | 2/2014 | Wei et al. |
| 2014/0065802 | A1* | 3/2014 | Chang ................. H01L 27/1211 438/479 |
| 2016/0197017 | A1 | 7/2016 | Ju |
| 2016/0225867 | A1* | 8/2016 | Kim ...................... H01L 29/517 |
| 2016/0240630 | A1* | 8/2016 | Seong ............. H01L 21/823842 |
| 2017/0358655 | A1* | 12/2017 | Bao ..................... H01L 29/4966 |
| 2019/0157410 | A1* | 5/2019 | Yim ................ H01L 21/823842 |

OTHER PUBLICATIONS

International Search Report and Written Opinion for International Patent Application No. PCT/US2016/054879 dated Jun. 27, 2017, 12 pgs.
Office Action from Taiwan Patent Application No. 106128463 dated Dec. 30, 2020, 10 pgs.
Notice of Allowance from Taiwan Patent Application No. 106128463 dated Apr. 30, 2021, 3 pgs.

\* cited by examiner

MULTI VOLTAGE THRESHOLD TRANSISTORS THROUGH PROCESS AND DESIGN-INDUCED MULTIPLE WORK FUNCTIONS

CROSS-REFERENCE TO RELATED APPLICATION

This patent application is a U.S. National Phase Application under 35 U.S.C. § 371 of International Application No. PCT/US2016/054879, filed Sep. 30, 2016, entitled "MULTI VOLTAGE THRESHOLD TRANSISTORS THROUGH PROCESS AND DESIGN-INDUCED MULTIPLE WORK FUNCTIONS," which designates the United States of America, the entire disclosure of which is hereby incorporated by reference in its entirety and for all purposes.

BACKGROUND

Field

Integrated circuit devices.

Description of Related Art

Microprocessors generally contain millions to billions of transistor devices that perform many different circuit functions. Different functions can require different device performance characteristics. One characteristic is voltage threshold. Channel implantation is a relatively effective and low cost approach for adjusting a voltage threshold of a transistor device but can degrade device performance due to enhanced channel scattering. Another approach to modify a voltage threshold is to modify the gate metal work function (WF) stack and the flat-band voltage. This approach has the benefit of retaining high channel mobility but has the drawback of higher fabrication cost due to a generally more complicated process flow, especially when multiple different WFs are required.

DETAILED DESCRIPTION

A technique for modulating a voltage threshold of a transistor device by controlling an amount of work function material on a transistor device channel is described. Such modulating can result in differential work function material on channels of different transistors and can be realized by modifying the layout design or through intentional process control. A device structure including transistor devices having different voltage thresholds is also described.

Figure 1:
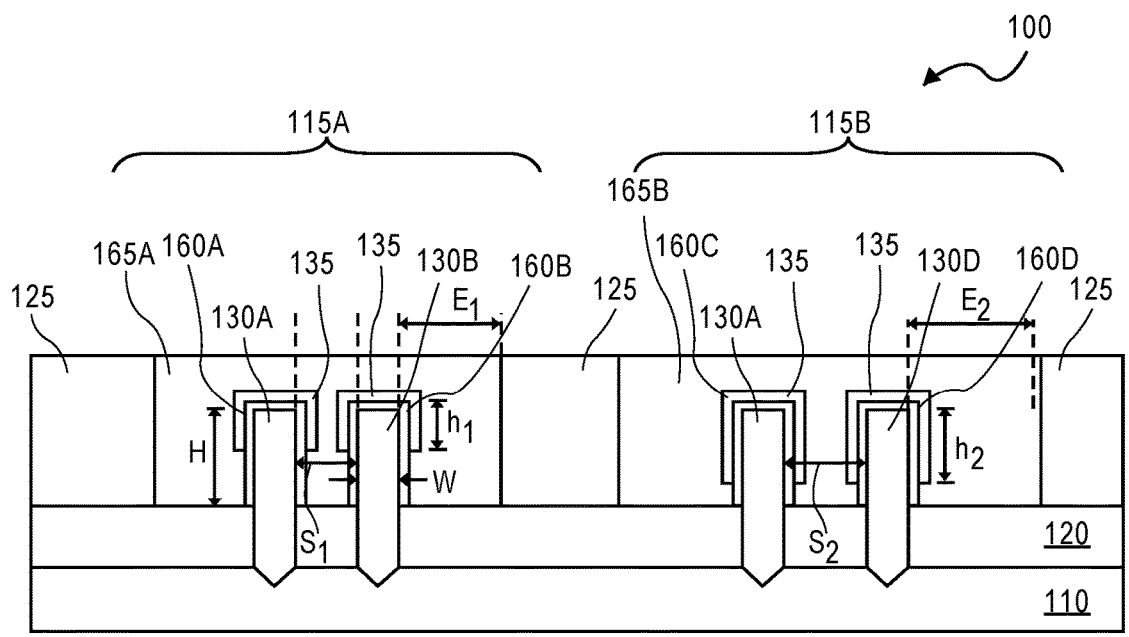
FIG. 1 shows a cross-sectional side view of an embodiment of non-planar field effect transistor devices in two device areas.
Figure 2:
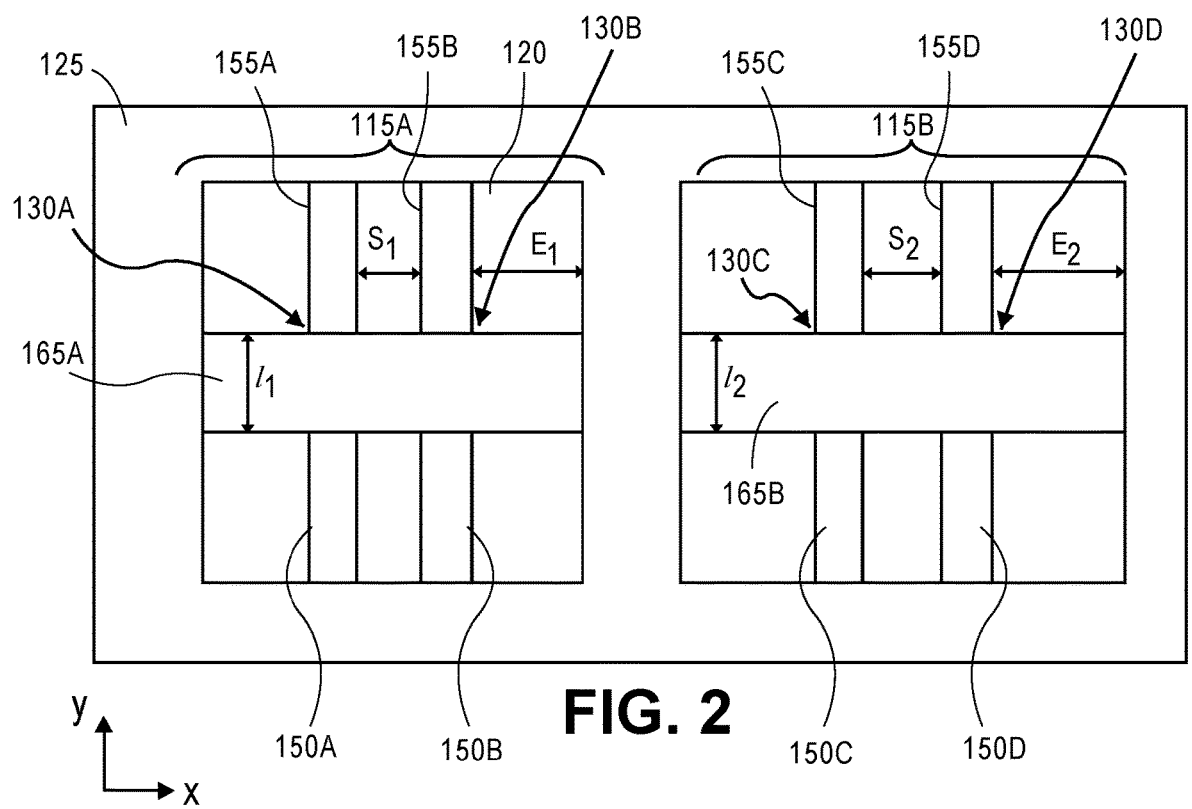
FIG. 2 shows a top view of the structure of FIG. 1.

FIG. 1 shows a cross-sectional side view of an embodiment of a structure that is a portion of an integrated circuit chip including two adjacent transistor device areas or cells where each device area or cell includes two field effect transistor (FET) devices such as metal oxide semiconductor field effect transistor (MOSFET) devices, tunneling field effect transistor (TFET) devices or other FET devices. FIG. 2 shows a top view of the structure of FIG. 1. The device areas are shown side-by-side in an x-direction. It is appreciated that the techniques described herein do not require that the device areas be directly side-by-side. Instead, device areas may be spaced by one or more device areas and also the device areas may be aligned in a y-dimension or offset in xy-dimensions. In this embodiment, non-planar transistors (e.g., multigate transistors) are illustrated. It is appreciated that the techniques described are applicable to other transistors including but not limited to planar and gate all-around devices.

Referring to FIG. 1 and FIG. 2, structure 100 includes substrate 110 that is, for example, a single crystal silicon substrate such as a bulk substrate or a silicon on insulator (SOI) substrate. Disposed on substrate 110, in this embodiment, is dielectric layer 120. Dielectric layer 120 is silicon dioxide or a dielectric material having a dielectric constant less than silicon dioxide such as carbon-doped silicon dioxide or a polymeric dielectric such as a polyimide.

As illustrated in FIG. 1, structure 100 is divided into two device areas, device area 115A and device area 115B. The device areas are defined by isolation formed of a dielectric material such as silicon dioxide or a low-k material formed on dielectric layer 120. Device area 115A and device area 115B are representatively shown to have a quadrilateral (e.g., rectangular) shape. It is appreciated that a shape of a device area may vary depending, for example, on circuit requirements or available tooling performance. Device area 115A and device area 115B are defined by isolation 125 on dielectric layer 120. Isolation 125 is, for example, a dielectric material such as silicon dioxide or a low-k material or a combination of silicon dioxide and a low-k material. Structure 100 in the embodiment illustrated in FIG. 1 and FIG. 2 show two device bodies or fins on substrate 110 in each of device area 115A and device area 115B. Specifically, FIG. 1 and FIG. 2 show fin 130A and fin 130B in device area 115A and fin 130C and fin 130D in device area 115B. Representatively, each fin has a height, H, on (above as viewed in FIG. 1) dielectric layer 120 on the order of 10 nanometers (nm) to 100 nm and a width, W, defined by opposing side walls on the order of 5 nm to 20 nm. Each of the fins 130A-130D representatively has a generally rectangular profile. It is also appreciated that a profile of a fin may vary depending on, for example, available tooling performance. While a rectangular profile may be targeted, a final shape of fins 130A-130D may be different and have, for example, rounded surface edges and/or irregular surfaces. In one embodiment, fin 130A and fin 130B have a fin-to-fin spacing, $S_1$ that is less than a fin-to-fin spacing, $S_2$ of fin 130C and fin 130D. A representative spacing difference is, for example, about 5 nm to 10 nm.

Disposed on a channel region of fins 130A and 130B in device area 115A and fins 130C and 130D in device area 115B in the embodiment illustrated in FIGS. 1 and 2 is a gate stack. Gate stack includes a gate dielectric surrounding a channel region of a fin and a gate electrode on the gate dielectric. FIG. 1 shows gate dielectric layer 160A of, for example, a silicon dioxide or a high-k material or a combination of silicon dioxide and a high-k material on fin 130A and gate dielectric layer 160B on fin 130B in device area 115A and gate dielectric layer 160C on fin 130C and gate dielectric layer 160D on fin 130D in device area 115B. A representative material for the gate dielectric layers (gate dielectric layers 160A-160D) is silicon dioxide or a high-k material or a combination of silicon dioxide and a high-k material. A representative thickness of the gate dielectric layers on the order of a few nanometers. FIG. 1 shows gate dielectric layers 160A and 160B disposed on sidewalls and a width dimension of fins 130A-130D.

Overlying the gate dielectric on each of fins 130A and 130B in device area 115A and the gate dielectric on each of fins 130C and 130D in device area 115B is work function material 135. Work function material 135 is an electrically conductive material selected, in one embodiment, to modulate a voltage threshold of a transistor device. A material for work function material generally depends in part on the type of transistor. For a PMOS transistor, a representative work function material is titanium nitride (TiN) or tantalum nitride (TaN). A representative work function material for an NMOS device is aluminum titanium nitride (AlTiN). In one embodiment, transistors in device area 115A are desired to have a different voltage threshold than transistors in device area 115B. One way transistor devices in one device area may have a voltage threshold that is different than a voltage threshold of transistor devices in another area is by an amount of work function material 135 on the respective transistors. FIG. 1 illustrates work function material 135 conformally formed on a channel region of each of fin 130A, fin 130B, fin 130C and fin 130D (e.g., on opposing sidewalls and top of each fin along the length of the channel). As illustrated in FIG. 1, assuming the fins in each of device area 115A and device area 115B have similar dimensions (e.g., similar height, length, width dimensions), the work function material on the sidewalls of fins 130A and 130B is less than the amount of work function material 135 on the sidewalls of fins 130C and 130D. FIG. 1 shows work function material 135 on the sidewalls of fins 130A and 130B at a height, $h_1$, that is less than a height, $h_2$ of work function material 135 on the sidewalls of fins 130C and 130D in device area 115B.

Also disposed on gate dielectric layers 160A and 160B is gate electrode 165A in device area 115A and on gate dielectric layers 160C and 160D in device area 115B is gate electrode 165B. A representative material for gate electrodes 165A and 165B is an electrically conductive material having greater conductivity than the respective work function material. Representative gate electrode material includes a metal material (e.g., tungsten) or a silicide. In one embodiment, gate electrodes 165A and 165B have a total thickness on the order of 50 nm to 100 nm. In one embodiment, gate electrode 165A has a gate length, $l_1$, that is similar to a gate length, $l_2$, of gate electrode 165B. In one embodiment, gate electrode 165A has a different end cap distance than gate electrode 165B, where an end cap distance is measured from an edge of a fin to an edge of the corresponding device area. In the embodiment shown in FIGS. 1-2, gate electrode 165A has an end cap distance, $E_1$, that is less than end cap distance, $E_2$ of gate electrode 165B. A representative difference in end cap distance is on the order of 10-50 nm. FIG. 2 also shows junction or diffusion regions (source/drain) on opposite sides of gate electrode 165A in device area 115A and gate electrode 165B in device area 115B. In device area 115A, FIG. 2 shows source 150A and drain 155A formed in or on fin 130A and source 150B and drain 155B formed in or on fin 130B. In device area 115B, FIG. 2 shows source 150C and drain 155C formed in or on fin 130C and source 150D and drain 155D formed in or on fin 130D.

Figure 3:
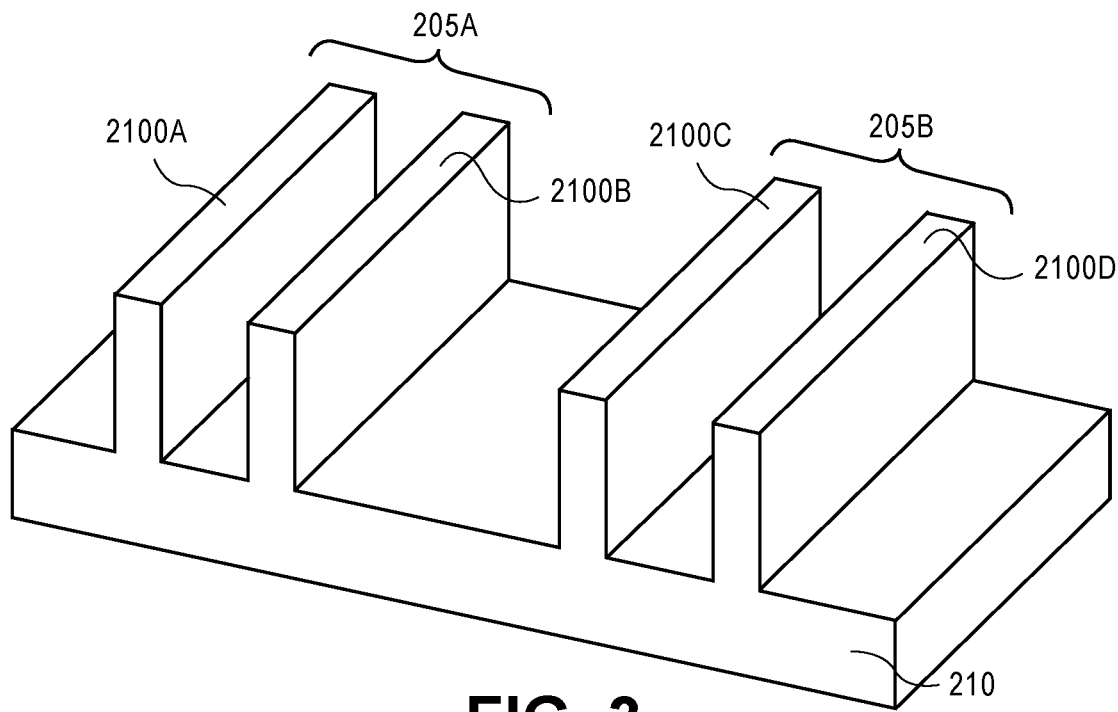
FIG. 3 shows a perspective side view of a substrate having fins formed therein.
Figure 18:
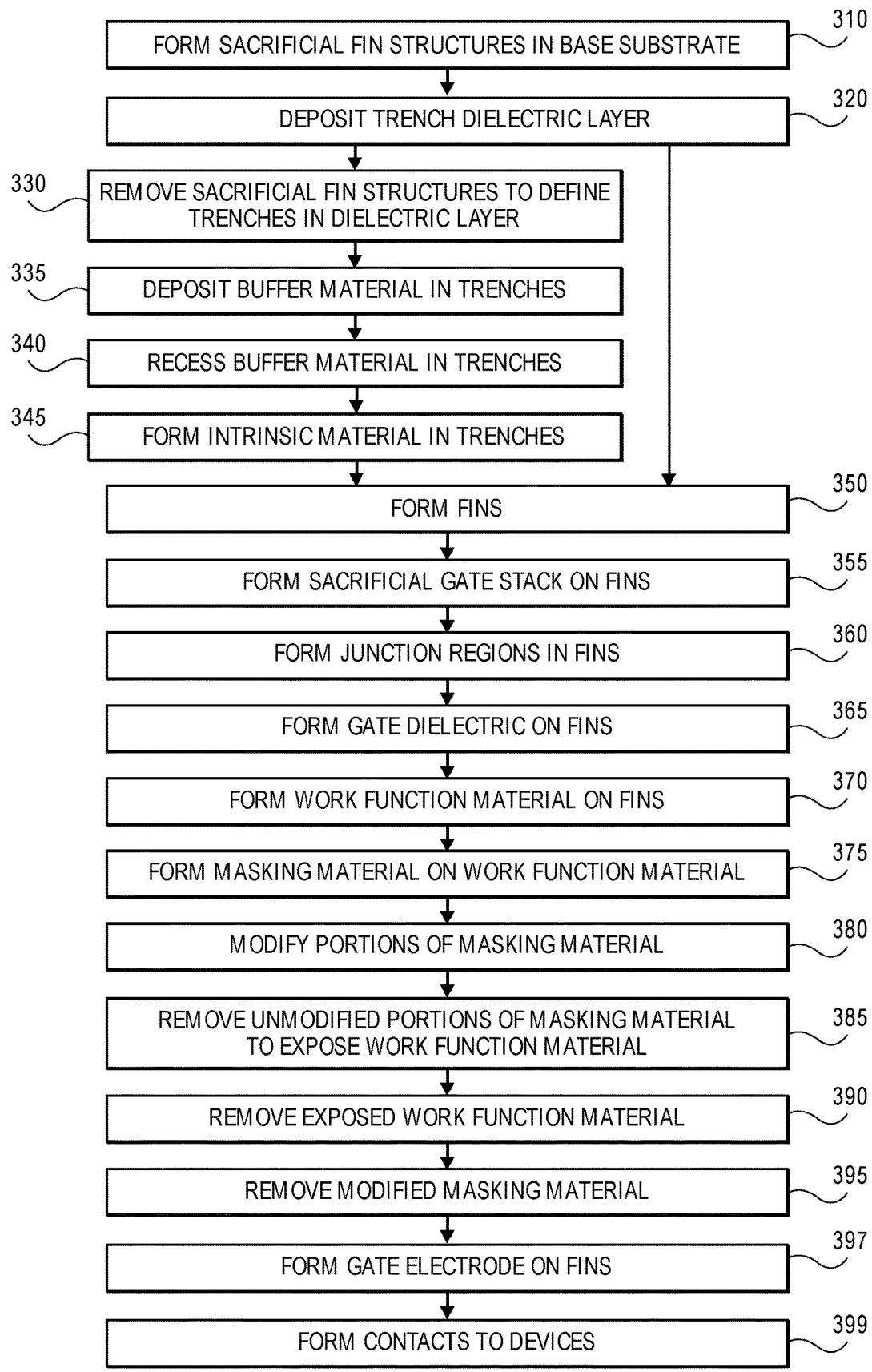
FIG. 18 presents a flow chart of the process described with reference to FIGS. 3-16.

FIGS. 3-14 describe a process of forming FET devices such as is illustrated in FIGS. 1-2. FIG. 18 presents a flow chart of the process. FIGS. 3-14 describe three-dimensional multigate FETs having a voltage threshold modulated by a work function material on a channel region of a device and different in two device areas of a substrate. Adjacent device areas are illustrated for ease of illustration. As noted above, the device areas need not be adjacent one another. Also, a description of forming transistor devices having two different voltage thresholds is presented with respect to two device areas. It is appreciated that more than two device areas may have different voltage thresholds and that, in such case, the voltage threshold of such devices in the multiple areas may be different in other areas. A formation process for an N-type FET is described. Referring to FIG. 3 and with reference to the flow chart of FIG. 18, the process begins by defining fin structures in a substrate material (block 310, FIG. 18). FIG. 3 shows a perspective side view of substrate 210 that may be any material that may serve as a foundation of which a multigate FET may be constructed. Representatively, substrate 210 is a portion of a larger substrate such as wafer. In one embodiment, substrate 210 is a semiconductor material such as single crystal silicon. Substrate 210 may be a bulk substrate or, in another embodiment, a semiconductor on insulator (SOI) structure. FIG. 3 shows substrate 210 following a patterning of the substrate to define fin 2100A and fin 2100B in first area 205A of substrate 210 and fin 2100C and fin 2100D in second area 205B. Fins 2100A-2100D may be formed by a mask and etch process wherein a mask (e.g., a hard mask) is introduced on a surface (superior surface as viewed) of substrate 210 to protect areas of the substrate where the fins will be defined and to provide openings in non-fin areas. Once the mask is patterned, substrate 210 may be etched to remove material in unprotected areas. A substrate of silicon may be etched with a wet or dry etch. Representatively, a suitable etchant is hydrofluoric (HF) acid based chemistry. Fins 2100A-2100D are etched to have a representative height, H, on the order of 100-400 nm.

Figure 4:
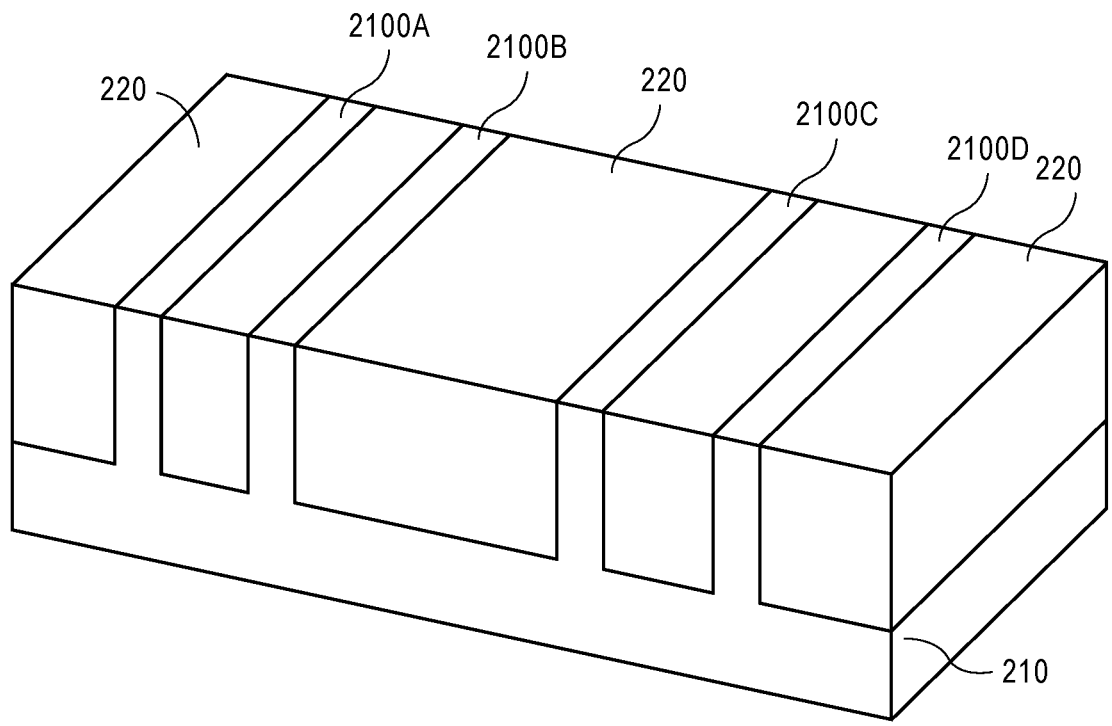
FIG. 4 shows the structure of FIG. 3 following a removal of the mask on the fins and following the deposition of a trench dielectric layer on the substrate

FIG. 4 shows the structure of FIG. 3 following a removal of the mask on the fins and following the deposition of a trench dielectric layer on the substrate (block 320, FIG. 18). In one embodiment, dielectric layer 220 is silicon dioxide or a low-k dielectric material or a combination of silicon dioxide and a low-k material. Following deposition of dielectric layer 220, the surface (a superior surface as viewed) of the structure is polished to the level of the top of fins 2100A-2100D so that the fins are exposed.

Figure 5:
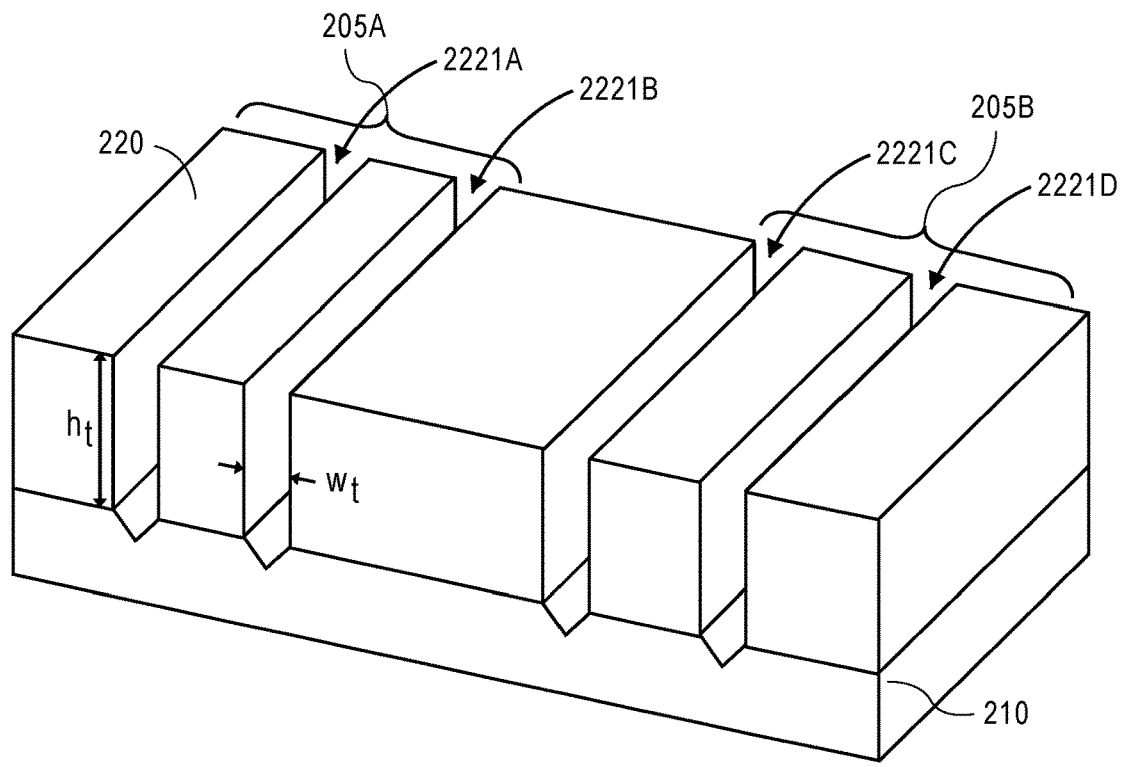
FIG. 5 shows the structure of FIG. 4 following the removal of the fins to form trenches of a controlled size and shape
Figure 6:
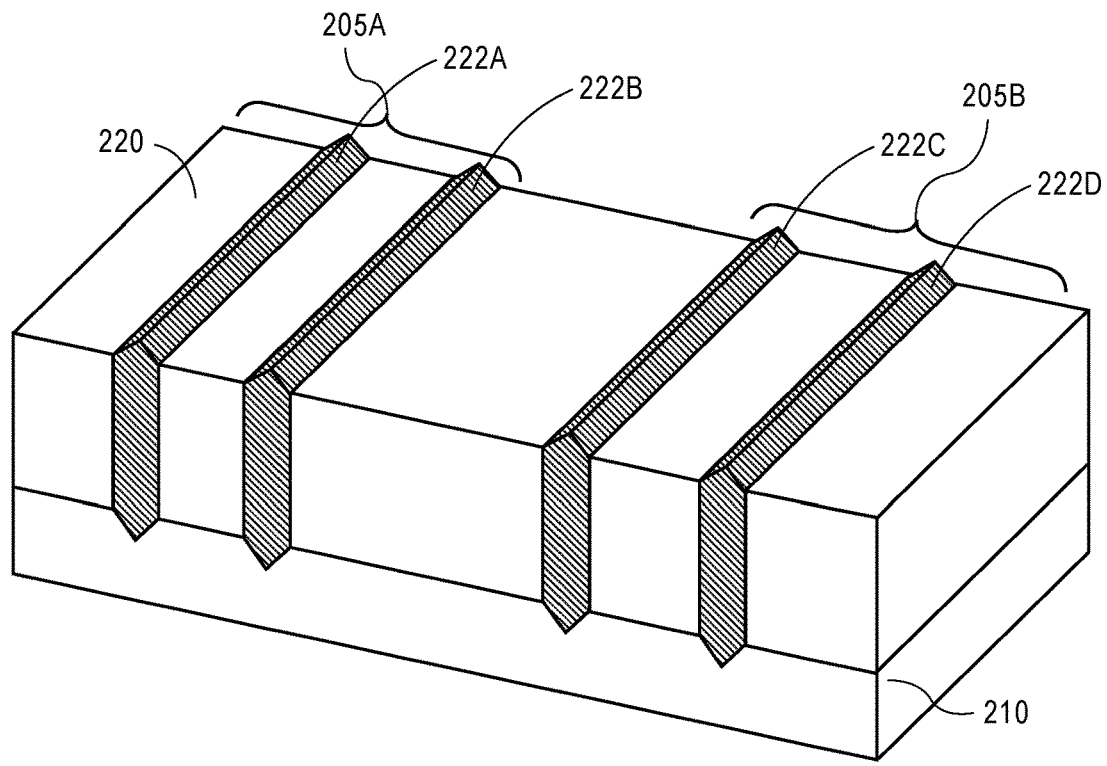
FIG. 6 shows the structure of FIG. 5 following the introduction of a buffer material in the trenches.
Figure 7:
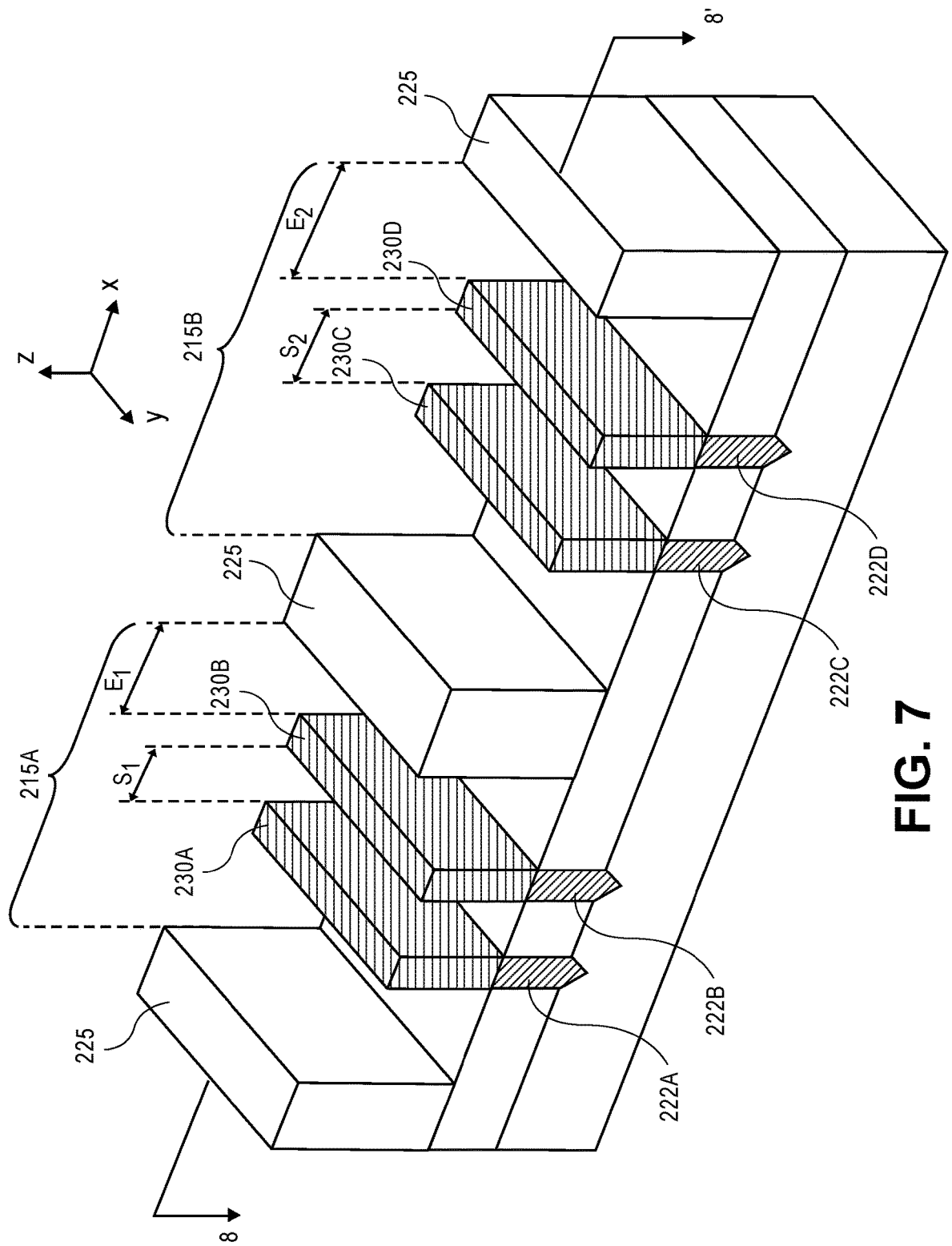
FIG. 7 shows the structure of FIG. 6 following a removal of a portion of the buffer material in each of respective trenches and the introduction of an intrinsic material into the trenches.

In one embodiment, fins 2100A-2100D are each used as a semiconductor body or fin. In another embodiment, fins 2100A-2100D are replaced with another material or materials. FIGS. 5-7 describe a replacement process. FIG. 5 shows the structure of FIG. 4 following the removal of fins 2100A-2100D to form trenches of a controlled size and shape (block 330, FIG. 18). Fins 2100A-2100D may be removed by mask and etch process wherein a mask is patterned on a surface of dielectric layer 220 leaving the sacrificial fins exposed followed by an etch process. Fins 2100A-2100D of a silicon material may be etched by a dry or wet etch or a combination of the two. Suitable etchants for etching fins of a silicon material include potassium hydroxide (KOH) and tetramethylammonium hydroxide (TMAH). The removal of the fins 2100A-2100D forms trench 2221A and trench 2221B in area 205A and trench 2221C and trench 2221D in area 205B. In one embodiment, the etching of fins 2100A-2100D may be performed to provide a {111} faceting at the bottom of each trench to facilitate a subsequent growth of a material in the trenches which is done using TMAH-like or any equivalent chemistry. Alternative geometries are also contemplated. The trench confined growth of materials offer an advantage of aspect ratio trapping (ART) whereby crystalline quality of the epitaxial layer is enhanced through trapping of threading dislocations, stacking faults, twins, etc., at sidewalls of trenches 2221A-2221D where defects terminate such that overlying layers may be increasingly defect-free. In one embodiment, to achieve ART, each of trenches 2221A-2221D have dimensions such that its height, $h_t$, is on the order of at least twice its width, $w_t$.

FIG. 6 shows the structure of FIG. 5 following the introduction of a buffer material in trenches 2221A-2221D (block 335, FIG. 18). In one embodiment, buffer material is a group III-V compound material such as, but not limited to, gallium arsenide (GaAs), indium phosphide (InP); germanium (Ge), gallium phosphide (GaP), gallium arsenide antimony (GaAsSb), indium aluminum arsenide (InAlAs) and gallium antimony (GaSb). The buffer material may be introduced by an epitaxial growth process. In another embodiment, the trenches may be filled with a first buffer of one of the noted materials followed by a second buffer of another of the noted materials. FIG. 6 shows buffer material 222A and buffer material 222B in respective trenches 2221A and 2221B in area 205A and buffer material 222C and buffer material 222B in respective trenches 2221C and 2221D in area 205B. FIG. 6 shows the buffer materials representatively including {111} faceted overgrowth protruding off the superior plane defined by a surface dielectric layer 220.

FIG. 7 shows the structure of FIG. 6 following a removal of a portion of buffer material in each of the respective trenches and the introduction of an intrinsic material into the trenches to form fins. In one embodiment, the removal of buffer materials 222A-222D is performed by an initial chemical mechanical polish (CMP) to planarize the buffer material with the superior plane defined by a surface of dielectric layer 220 (see FIG. 6). Buffer materials 222A-222D are subsequently recessed in respective trenches 2221A-2221D by a wet or dry etch process (block 340, FIG. 18). A suitable etchant for etching a buffer material of InP is a hydrochloric (HCl) acid solution. Once buffer materials 222A-222D are recessed in respective trenches 2221A-2221D, intrinsic material is introduced into the trenches to form fins. FIG. 7 shows fin 230A formed on buffer material 222A; fin 230B formed on buffer material 222B; fin 230C formed on buffer material 222C; and fin 230D formed on buffer material 222D (block 345, FIG. 18). The intrinsic material to form fins 230A-230D may be epitaxially grown. In one embodiment, the intrinsic material is an indium-containing group III-V compound material that may be lightly doped n-type or p-type to the extent of, for example, 1E16 atoms per cubic centimeters. In one embodiment, fins 230A-230D are InGaAs. Fins 230A-230D have a representative height on the order of 40 nm to 100 nm.

FIG. 7 shows the structure following a polish of the fins to a plane defined by dielectric layer 220 and after a subsequent recession of dielectric layer 220 (e.g., by etching) such that fins 230A-230D are protruding above a plane defined by dielectric layer as transistor bodies or fins (block 350, FIG. 18). FIG. 7 shows that fins 230A and 230B in device area 215A are separated by a fin spacing, $S_1$, and fins 230C and 230D in device area 215B are separated by a fin spacing, $S_2$. In one embodiment, $S_1$ is less than $S_2$. A representative fin spacing, $S_1$ is 20 nm and a fin spacing, $S_2$ is 30 nm. Fins 230A-230D are shown with right angled edges. It is appreciated that the shape of the fins depends, in part, on the process tooling and thus the fins may have other than right-angled edges, such as curved edges and/or non-parallel sidewalls. As noted above, replacement of fins 2100A-2100D with a buffer or sub-fin material(s) and an intrinsic material where the intrinsic material will serve as a body of a transistor device is one embodiment and, in another embodiment, fins 2100A-2100B formed of a material of substrate 210 (see FIGS. 3 and 4) may alternatively serve as transistor bodies. The following discussion will refer to fins of layers 230A-230D but it should be appreciated that fins 2100A-2100B could alternatively be utilized as the transistor bodies. Thus, for example, in the embodiment where fins 2100A-2100D are utilized as the transistor bodies of respective transistor devices, dielectric layer 220 in FIG. 4 is recessed to expose a portion of each of fins 2100A-2100D above dielectric layer 220 resemble the structure of FIG. 7.

Once dielectric layer 220 is recessed and bodies or fins of layers 230A-230D are exposed, gate-to-gate isolation 225 is introduced. Gate-to-gate isolation 225 of a dielectric material such as $SiO_2$ or a low-k dielectric or a combination of $SiO_2$ and a low-k dielectric may be introduced by a deposition process. In one embodiment, gate-to-gate isolation 225 is formed on each side of a device area (e.g., FIG. 2). FIG. 7 shows gate-to-gate isolation 225 extending in the direction approximately parallel to the transistor bodies or fins. It is appreciated that gate-to-gate isolation 225 also extends in a direction transverse to the transistor bodies or fins at a front and backside of the fins, respectively. Gate-to-gate isolation 225 defines device area 215A and device area 215B. In one embodiment, fins 230A and 230B in device area 215A have a fin spacing, $S_1$, that is less than a fin spacing, $S_2$, of fins 230C and 230D. A representative fin spacing difference is on the order of a few nanometers to 50 nanometers. A representative spacing, $S_1$, of fins 230A and 230B is 20 nm and a spacing, $S_2$ of fins 230C and 230D is 30 nm. In one embodiment, device area 215A has a different end cap distance than device area 215B with an end cap distance being defined as the distance from an edge of a fin in the respective area to the corresponding x-direction edge of gate-to-gate isolation 225. FIG. 7 shows end cap distance, $E_1$, in device area 215A that is less than an end cap distance, $E_2$, in device area 215B. A representative end cap distance difference of the fins in device area 215A and the fins in device area 215B is on the order of 10 nm to 100 nm. A representative end cap distance, $E_1$ is on the order of 50 nm. A representative end cap distance, $E_2$, is on the order of 70 nm.

Figure 8:
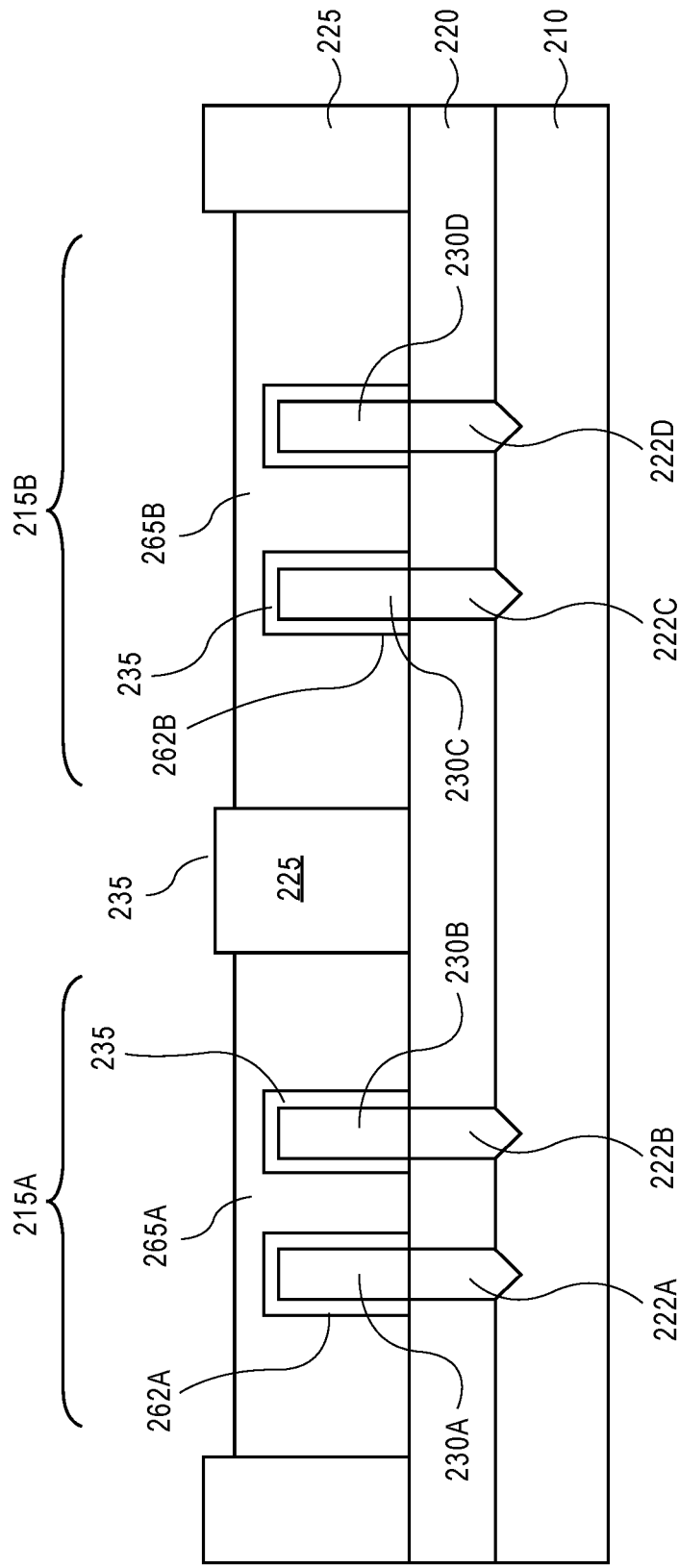
FIG. 8 shows the structure of FIG. 7 through line 8-8' after formation of a sacrificial stack on the fins in each device area.

FIG. 8 shows the structure of FIG. 7 following the formation of a sacrificial or dummy gate stack on fins 230A and 230B in device area 215A and a separate sacrificial or dummy gate stack on fins 230C and 230D in device area 215B (block 355, FIG. 18). In one embodiment, a sacrificial gate stack includes gate dielectric layer 262A of, for example, silicon dioxide or a high-k dielectric material in device area 215A and gate dielectric layer 262B in device area 215B. Disposed on gate dielectric layer 262A and gate dielectric layer 262B, in one embodiment, is dummy gate 265A and dummy gate 265B, respectively, of, for example, polysilicon deposited by, for example, a chemical vapor deposition method. In one embodiment, to form a gate stack, a mask material is introduced over the structure and patterned to have an opening for the gate stack. A gate stack is then introduced in the opening in a gate-last process. The gate stack may include a spacer dielectric layer defining spacers on opposite sides thereof.

Figure 9:
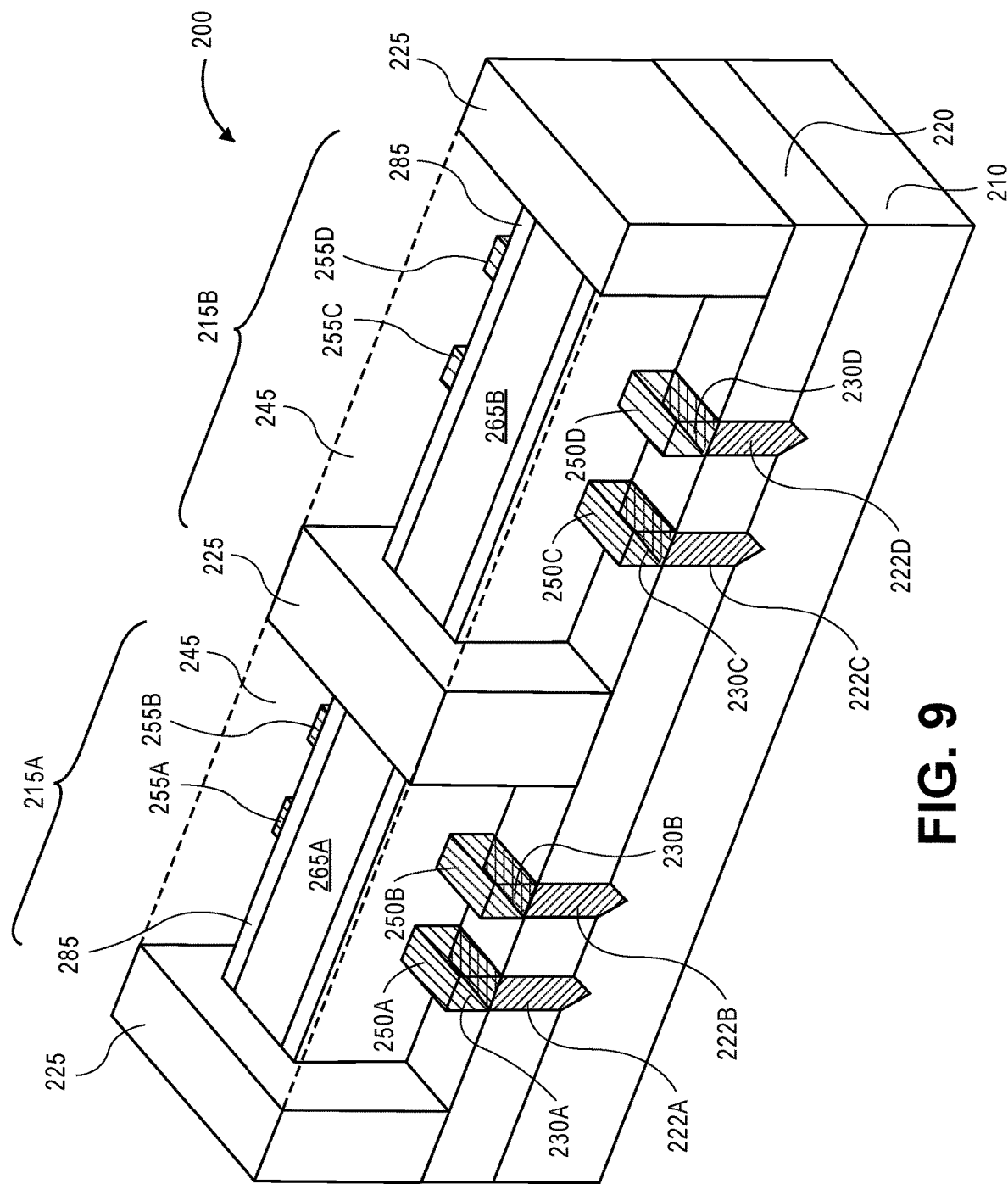
FIG. 9 shows a top side perspective view of the structure of FIG. 8 following a deposition of a dielectric material on the structure.

FIG. 9 shows a top, side perspective view of the structure of FIG. 8 following the definition of junction or diffusion regions in each device area. In this embodiment, sidewall spacers 285 of a dielectric material such as silicon dioxide or a low-k material is disposed on opposite sides of the sacrificial gate stacks. Sidewall spacers 285 are, for example, silicon dioxide or a low-k dielectric material that may be formed by depositing a material and patterning the deposited material into spacers. FIG. 9 shows structure 200 including junction region or source 250A and 250B and junction region or drain 255A and 255B in respective fins 230A and 230B in device area 215A and junction region or source 250C and 250D and junction region or drain 255C and 255D in respective fins 230C and 230D in device area 215B. Representatively, the junction regions (source and drain) are defined, in one embodiment, by removing portions of fins 230A-230D in junction regions and replacing the removed portions with a material of intrinsic layers 240A and 240B (InGaAs) or another desired material (replaced with a deposit of junction region material (block 360, FIG. 18). In another embodiment, the junction regions may be formed by doping of such fin portions. In a third embodiment, a material may be deposited as a cladding on portions of fins 230A-230D in the junction regions to form the junction regions.

Following formation of junction regions, a dielectric material is introduced on the structure (on structure 200 (on a surface including the junction regions and the sacrificial gate stack)). In one embodiment, the dielectric material is silicon dioxide or a low-k material or a combination of materials (e.g., multiple low-k material of silicon dioxide and one or more low-k materials). FIG. 9 shows dielectric material 245 in dashed lines.

Figure 10:
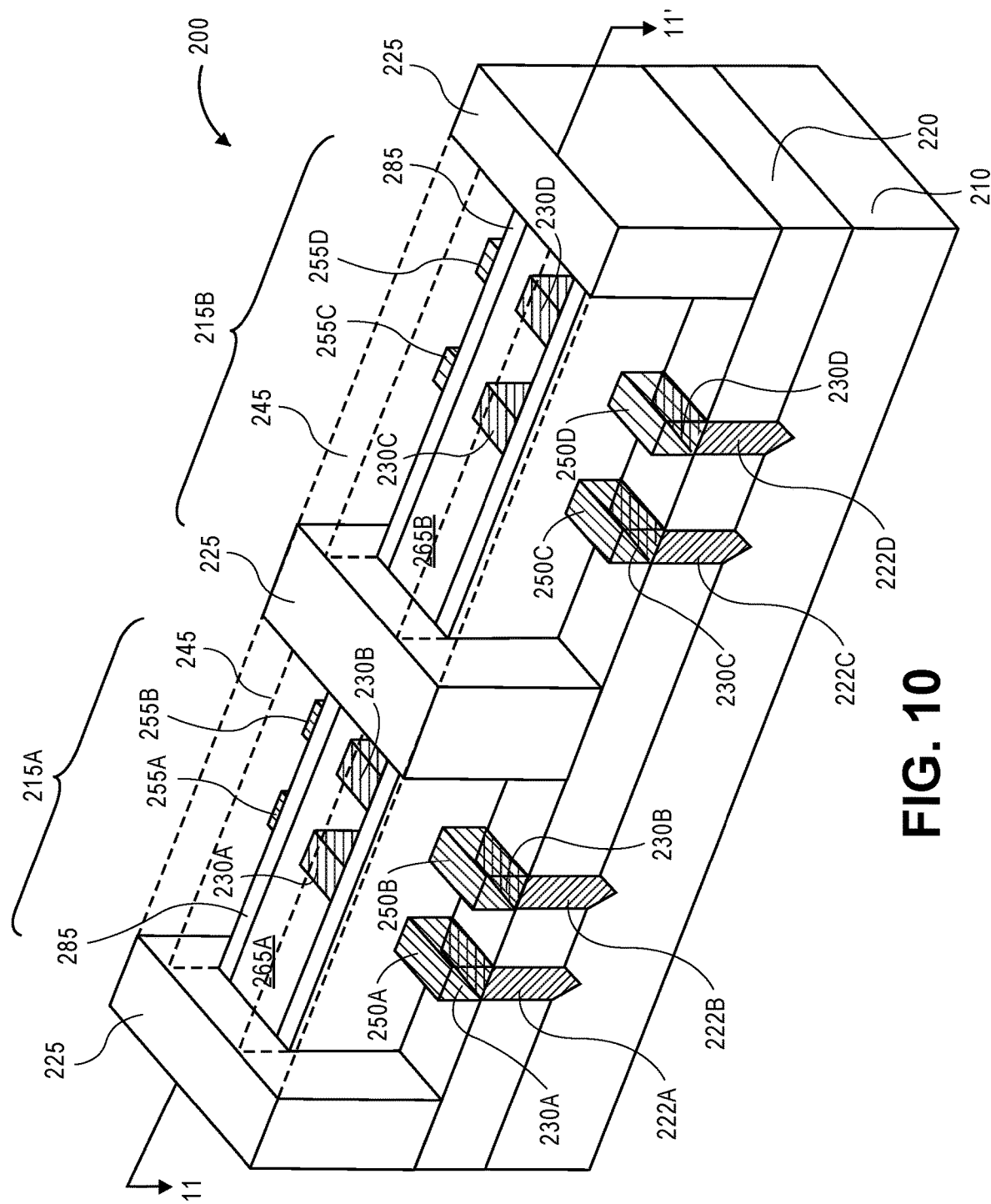
FIG. 10 shows the structure of FIG. 9 following a removal of the sacrificial gate stacks to expose the fins in each device area.

FIG. 10 shows the structure of FIG. 9 following a removal of the sacrificial gate stack in each device area. In one embodiment, a sacrificial gate stack may be removed by a mask and etch process where a mask is formed on a surface of dielectric layer 245 with an opening over an area of the dielectric layer above sacrificial gate 265A in device area 215A and above sacrificial gate 265B in device area 215B. Following the formation of the mask, dielectric layer 245 and the sacrificial gate stack in each of area 215A and 215B may be removed by an etch process.

Figure 11:
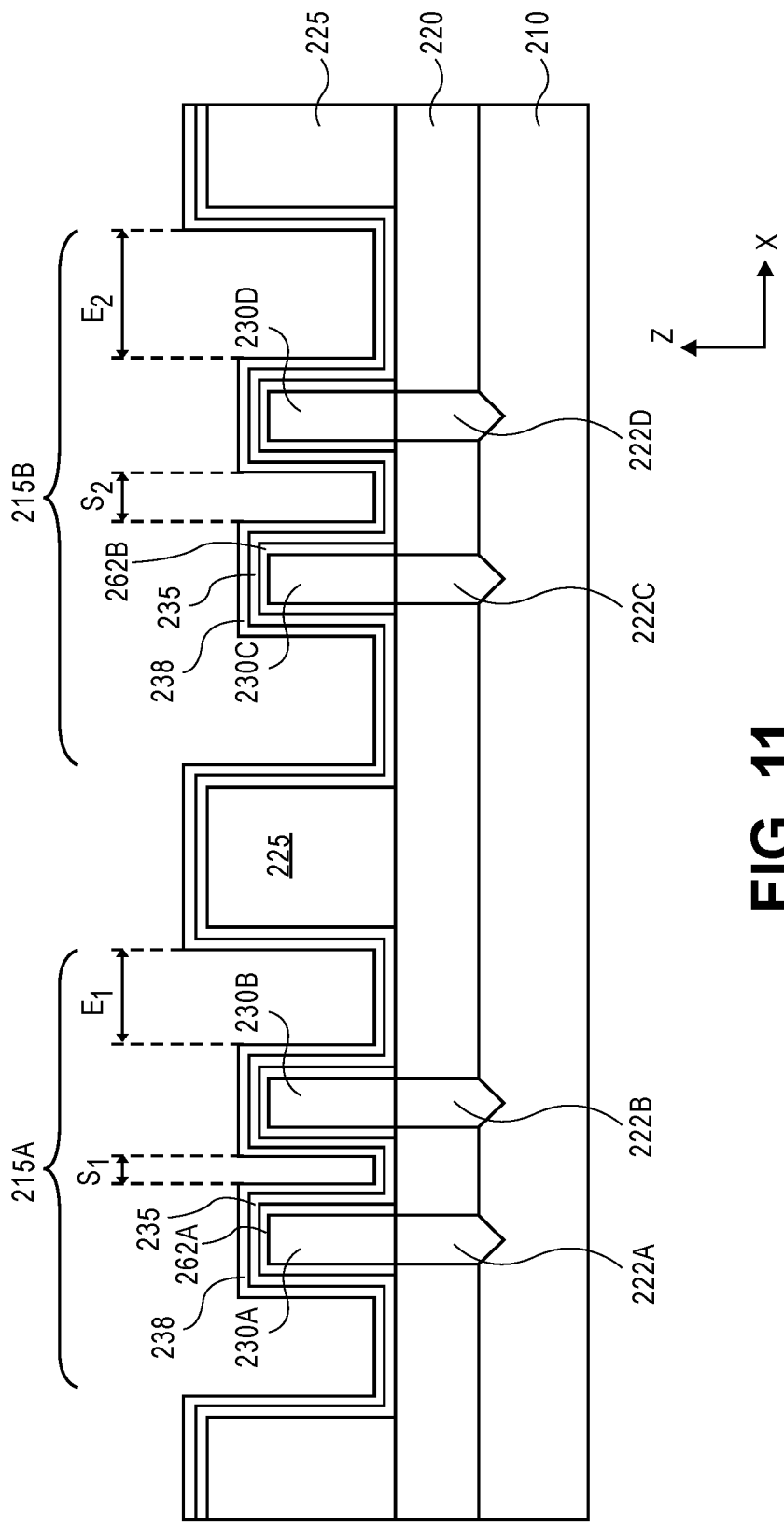
FIG. 11 shows a structure of FIG. 10 through line 11-11' after an introduction of a gate dielectric on the fins and a conformal introduction of a work function material and a masking material.

FIG. 11 shows the structure of FIG. 10 through line 11-11'. FIG. 11 shows the structure following introduction of a gate dielectric on the fins in each device area and a work function material is conformally deposited on the structure including in both of device area 215A and device 215B and on gate-to-gate isolation 225 (block 370, FIG. 18). FIG. 11 shows gate dielectric 262A on each of fin 230A and fin 230B in device area 215A and gate dielectric 262B on each of fin 230C and fin 230D in device area 215B. A suitable material for gate dielectric 262A and gate dielectric 262B is silicon dioxide or a high-k material(s) or a combination of silicon dioxide and a high-k material(s) that may be deposited to a thickness on the order of a few nanometers or less (block 365, FIG. 18). Following the formation of a gate dielectric on fins 230A-230D, a work function material is deposited on the fins. For N-type transistors, a representative work function material is AlTiN. FIG. 8 shows work function material 235 deposited by, for example, chemical vapor deposition (CVD), to a thickness on the order of 30 nm. Work function material is deposited on the entire length of each exposed fin (e.g., a channel length of each of fin 230A-230D). Following a deposition of work function material 235, a masking material is conformally deposited on the structure (block 375, FIG. 18). FIG. 11 shows masking material 238 deposited (covering) work function material 235. A representative material for masking material is a material that may be modified (e.g., doped) by an ion implantation and also is easily removable. One such material is silicon that may be deposited by CVD. Silicon may be modified with, for example, boron, nitrogen or other implant material. A representative thickness of masking material 238 is such that the material can protect the underlying work function material 235 from ion implantation. A representative thickness is on the order of 20 nm.

Figure 12:
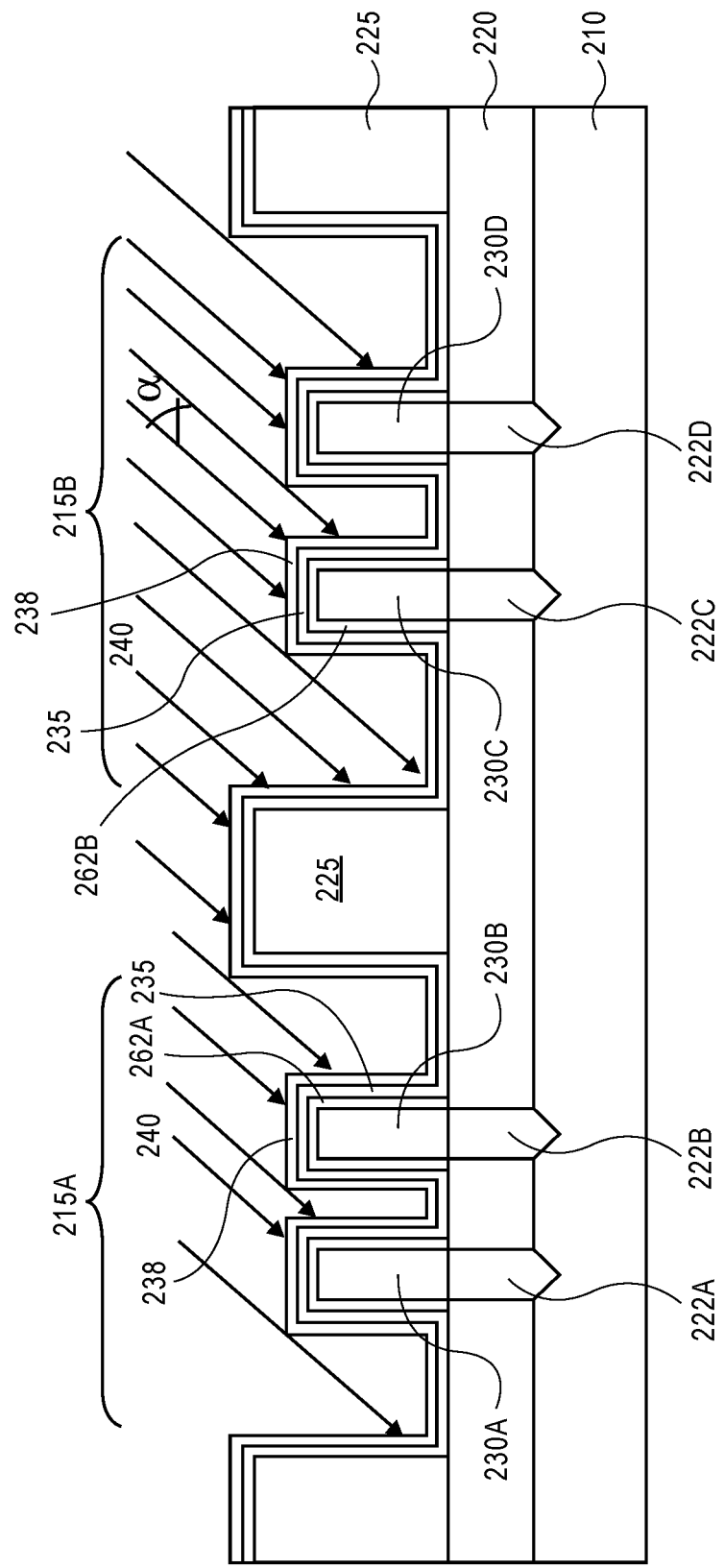
FIG. 12 shows the structure of FIG. 11 undergoing an angled ion implantation.

FIG. 12 shows the structure of FIG. 11 undergoing an ion implantation. In one embodiment, ion implantation 240 is a low energy implant applied at an angle, $\alpha$, that is less than 90° (not perpendicular) selected based in part on the fin spacing in device areas 215A and 215B and the respective end cap distance such that in device area 215B, a larger area of the masking material on fins 230C and 230D receives the ion implant than an area of the masking material on fins 230A and 230B in device area 215A (block 380, FIG. 18). A representative angle, $\alpha$, is on the order of 45 degree given a fin spacing difference $(S_2-S_1)$ of 20 nm and an end cap difference $(E_2-E_1)$ of 20 nm. An implant angle is determined in one aspect by fin spacing aspect ratio. With higher aspect ratio (taller fin and closer to each other), a greater angle is required.

Figure 13:
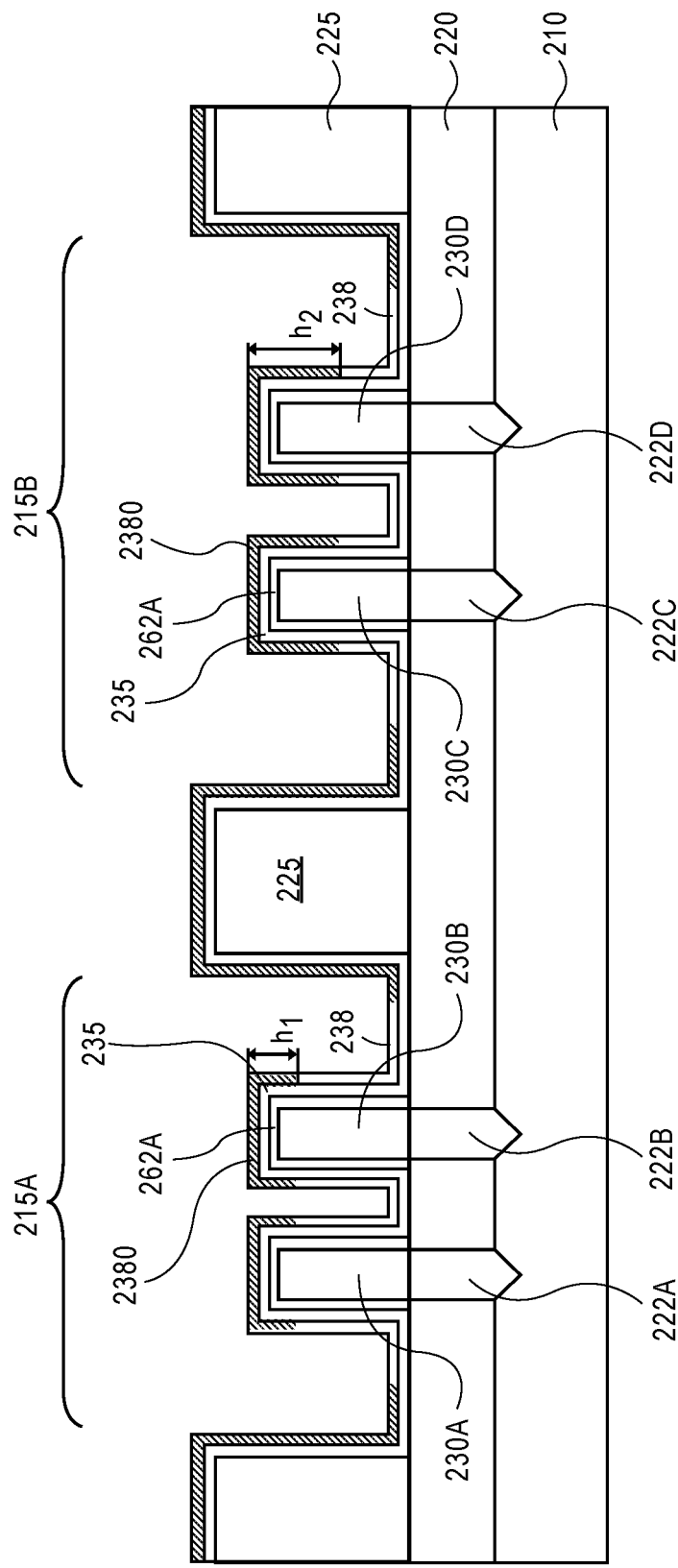
FIG. 13 shows the structure of FIG. 12 following the modification of a portion of the masking material by ion implantation.

FIG. 13 shows the structure of FIG. 12 following the ion implantation of masking material 238. FIG. 13 shows masking material 238 having been modified (e.g., doped) by the ion implantation more in device area 215B than device area 215A with respect to the masking material that is on the fins (on the sidewalls and a top of fin as viewed). Relative to sidewall portions of the fins, FIG. 13 illustrates that portion of masking material 238 that is modified has a representative height, $h_1$, on fins 230A and 230B and a height, $h_2$, on fins 230C and 230D, with $h_2$ being greater than $h_1$. Modified masking material 238 is referenced by reference numeral 2380.

Figure 14:
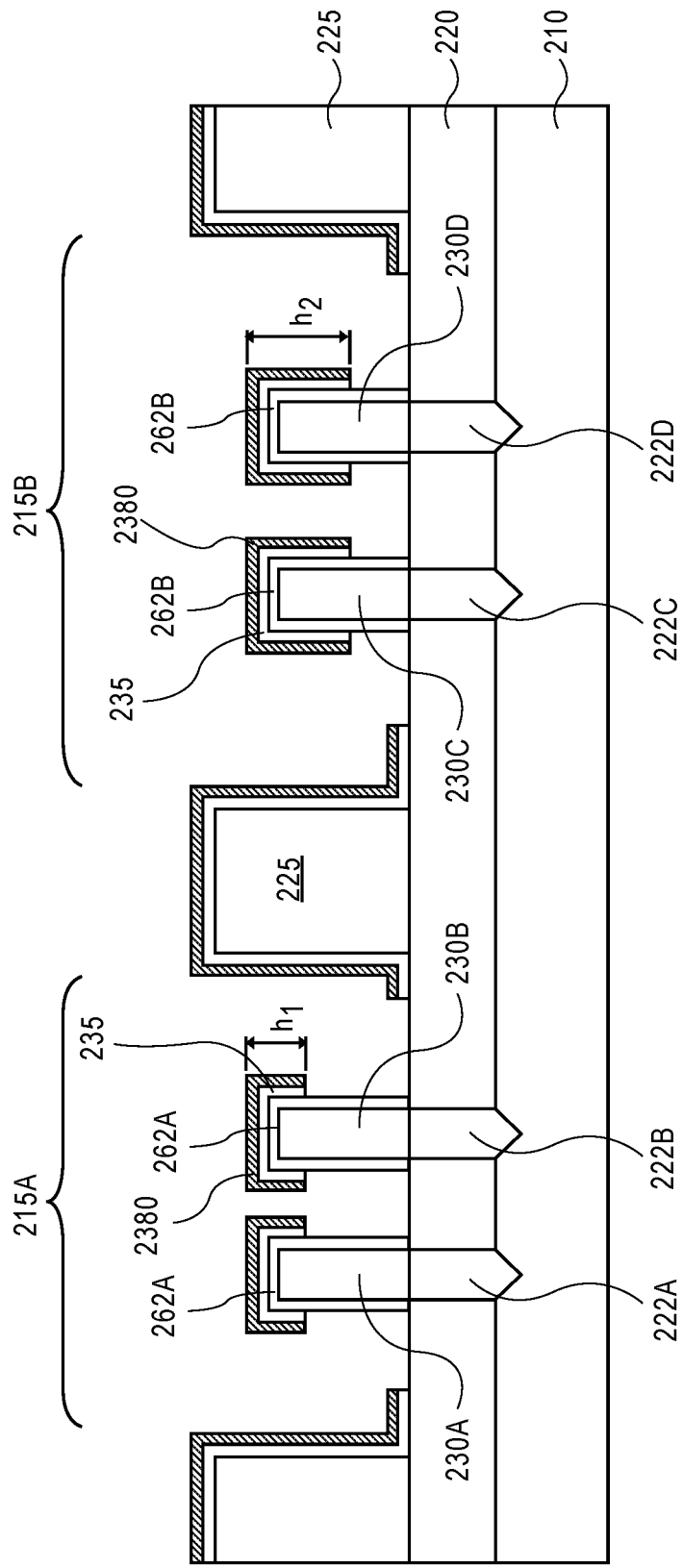
FIG. 14 shows the structure of FIG. 13 following the removal of an unmodified masking material and the work function material that was exposed by the removal of the unmodified masking material.

FIG. 14 shows the structure of FIG. 13 following the removal of unmodified masking material 238 (block 385, FIG. 18). If masking material 238 is silicon, masking material 238 may be removed by a wet clean. A wet clean chemistry for an undoped silicon material is, for example, a nitric acid ($HNO_3$) and hydrofluoric acid (HF) wet clean. FIG. 14 shows modified (e.g., doped) masking material 2380 remaining following the wet clean with such modification making the masking material resistance to the wet clean. FIG. 14 also shows the structure following a removal of exposed work function material 235 (exposed by the removal of unmodified masking material 238) (block 390, FIG. 18). Exposed work function material 235 may be removed with a wet clean with a SC1 solution (ammonia and hydrogen peroxide).

Figure 15:
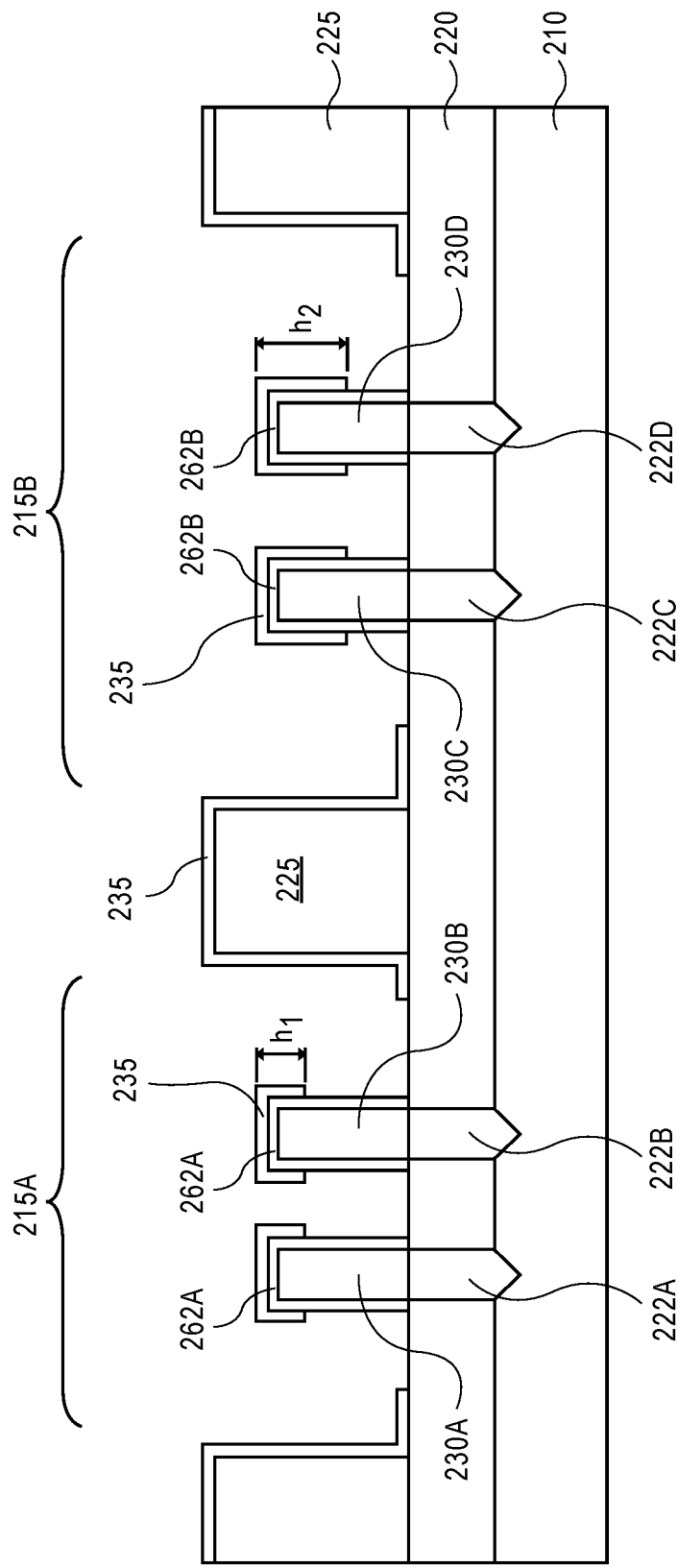
FIG. 15 shows the structure of FIG. 14 following the removal of the modified masking material.

FIG. 15 shows the structure of FIG. 14 following the removal of modified masking material 2380 (block 395, FIG. 18). In one embodiment, a modified masking material of doped silicon may be removed by TMAH. Following a removal of the modified masking material, work function material 235 remains on the transistor bodies in areas that were previously protected by modified masking material 2380. FIG. 12 shows work function material 235 on fins 230A and 230B having a height, $h_1$, measured along the sidewalls of the fins and a height, $h_2$, on fins 230C and 230D, with $h_2$ being greater than $h_1$. The difference in $h_2$ and $h_1$ indicates that fins 230C and 230D have more work function material on them than fins 230A and 230B.

Figure 16:
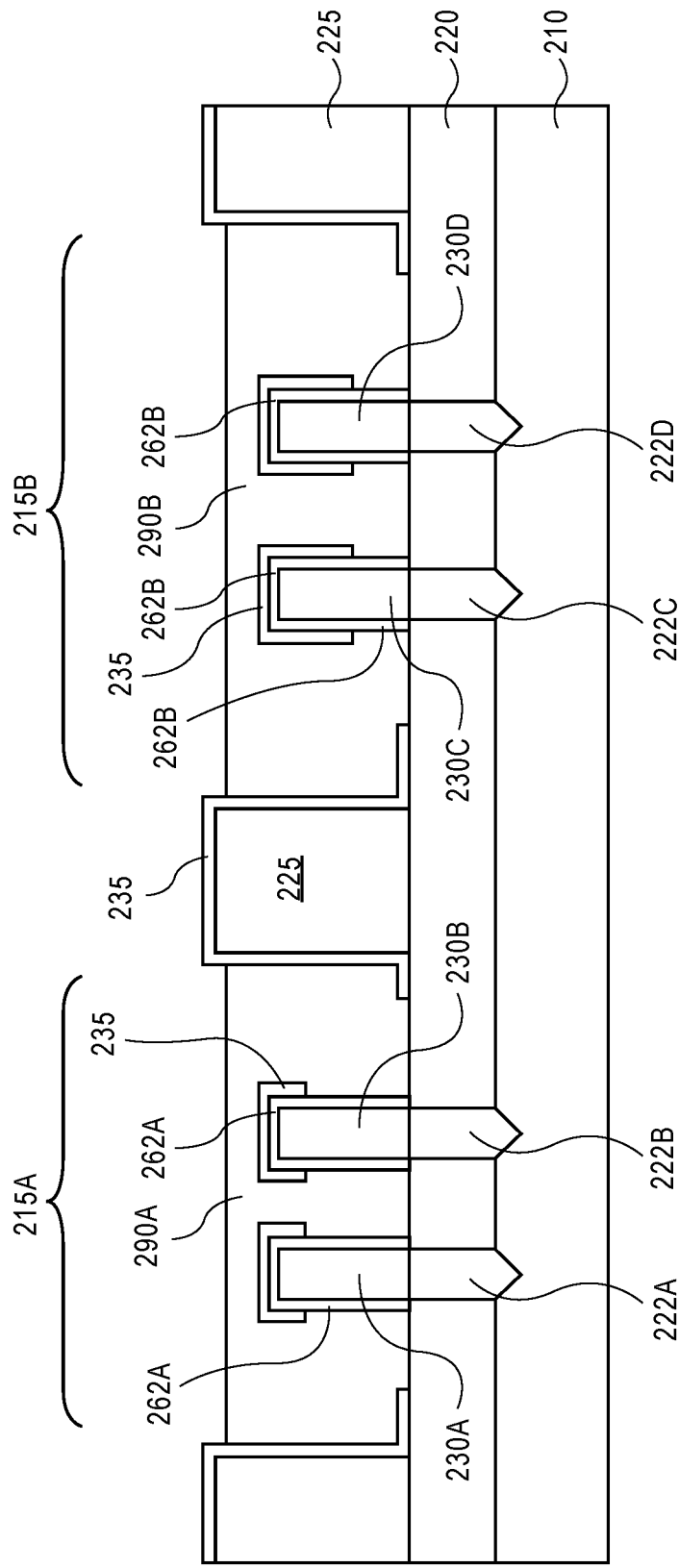
FIG. 16 shows the structure of FIG. 15 following the formation of a gate electrode on the fins in each device area.
Figure 17:
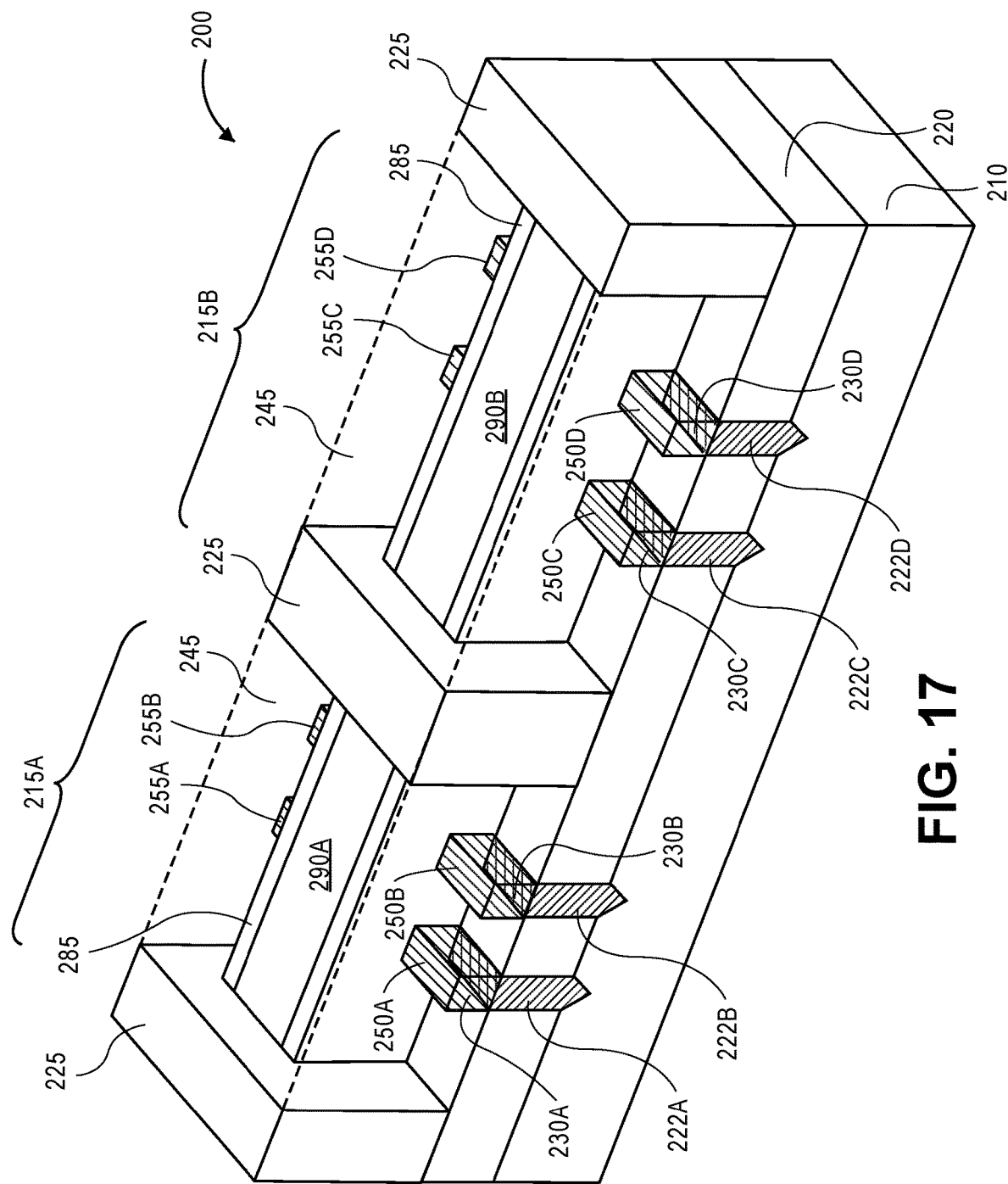
FIG. 17 shows a top, side perspective view of the structure of FIG. 16 following the deposition of a dielectric material on the structure.

FIG. 16 shows the structure of FIG. 15 following the deposition of a gate electrode material in each device area (block 397, FIG. 18). FIG. 17 is a top side perspective view of structure 200 of FIG. 17. FIGS. 16 and 17 show structure 200 including gate electrode 290A in device area 215A and gate electrode 290B in device area 215B. Representative materials for a metal gate electrode include tungsten, tantalum, titanium or a nitride, a metal alloy or another material. Following the formation of gate electrodes 290A and 290B, a dielectric material of silicon dioxide or a low-k material may be introduced in the prior opening in dielectric layer 245 to expose the fins in a channel region of each device. The resulting structure is similar to that illustrated above in FIGS. 1 and 2. Contacts may be made to individual junction regions and to gate electrodes as desired according to known techniques (block 399, FIG. 18).

Figure 19:
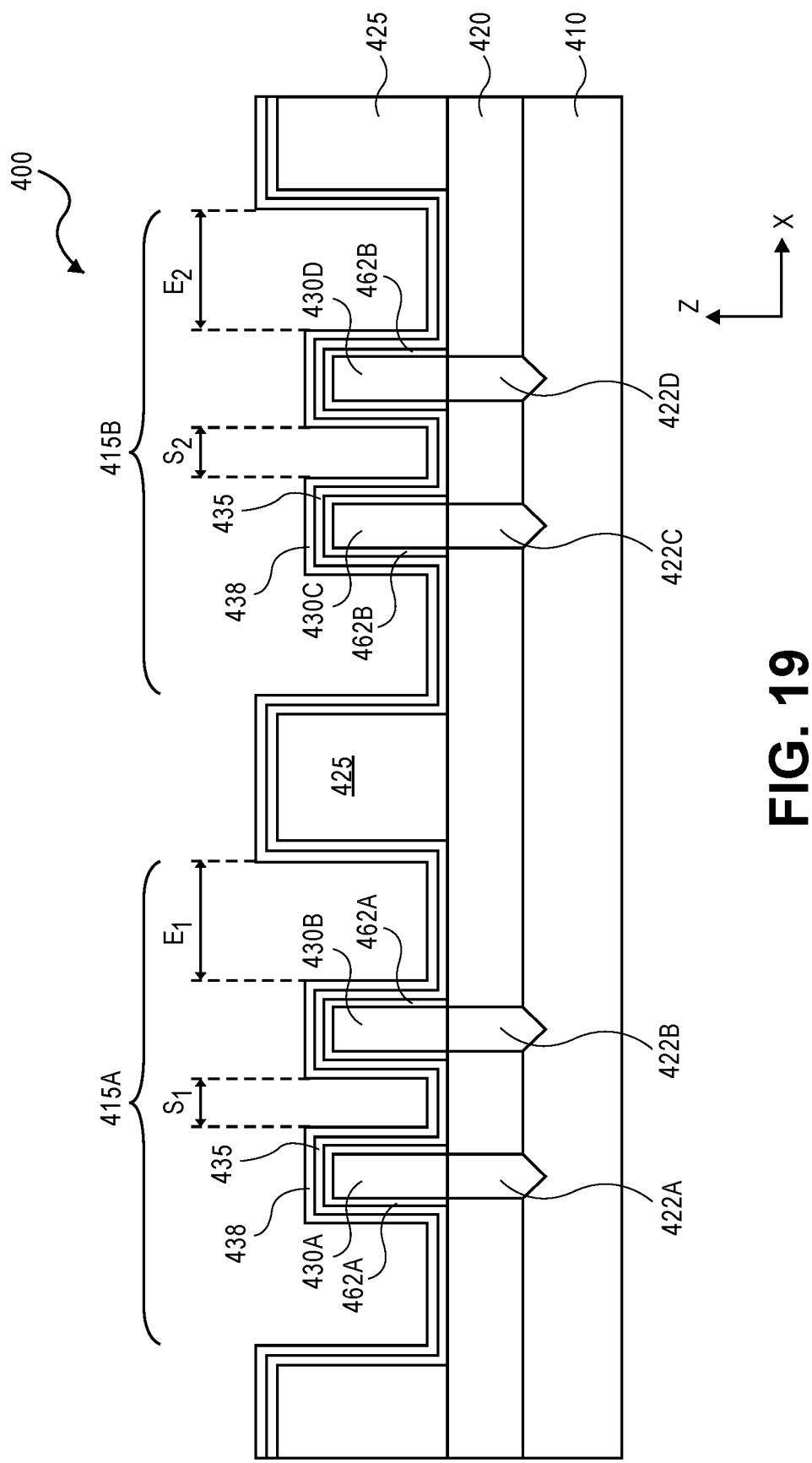
FIG. 19 shows a cross-sectional side view of a device structure including two device areas each containing two transistor bodies or fins and gate dielectric material on the fins and a work function material layer and a masking material layer conformally deposited on the structure according to another embodiment.

FIGS. 19-24 show a second embodiment of a method for forming transistor devices having different voltage thresholds in different device areas through a modulation of work function material on transistor bodies or fins in the device areas. FIG. 25 presents a flow chart of the method. Referring to FIG. 19, FIG. 19 shows a cross-sectional side view of a device structure such as a portion of a wafer. Structure 400 includes substrate 410 of a semiconductor material such as, a single crystal silicon or silicon on insulator. Disposed on substrate 410 is dielectric material layer 420 and buffer layers 422A, 422B, 422C and 422D of which transistor bodies or fins 430A, 430B, 430C and 430D are disposed and project above dielectric layer 420. Fins 430A and 430B are located in device area 415A and fins 430C and 430D are located in device area 415B. Device areas 415A and 415B are defined by gate-to-gate isolation 425. A process or method for forming the device areas and fins, in one embodiment, is described above with reference to FIGS. 3-7 and FIG. 18, blocks 310-350. Alternatively, fins 430A-430D may be formed of a material of substrate 410 (e.g., silicon) such as described above with reference to FIGS. 3-4 and 7.

The cross-sectional view of FIG. 19 is through a gate area of structure 400 (through an area for a gate stack on a channel in device 415A and device area 415B). In one embodiment, only the gate area of the device areas is exposed and junction or diffusion regions (source/drain), having previously been formed are protected by dielectric material. The formation of junction or diffusion regions and the deposition of a dielectric layer on the structure (e.g., an ILD0) and an exposure of gate areas, in one embodiment, is described above with reference to FIGS. 8-10 and FIG. 18, blocks 355-365. Referring to FIG. 19, in one embodiment, fins 430A and 430B have a fin spacing, $S_1$, that may be equal to, lesser or greater than a fin spacing, $S_2$, of fins 430C and 430D in device area 415B. Similarly, device area 415A has an end cap distance, $E_1$, that is equal to, lesser or greater than an end cap distance, $E_2$, in device area 415B.

Figure 20:
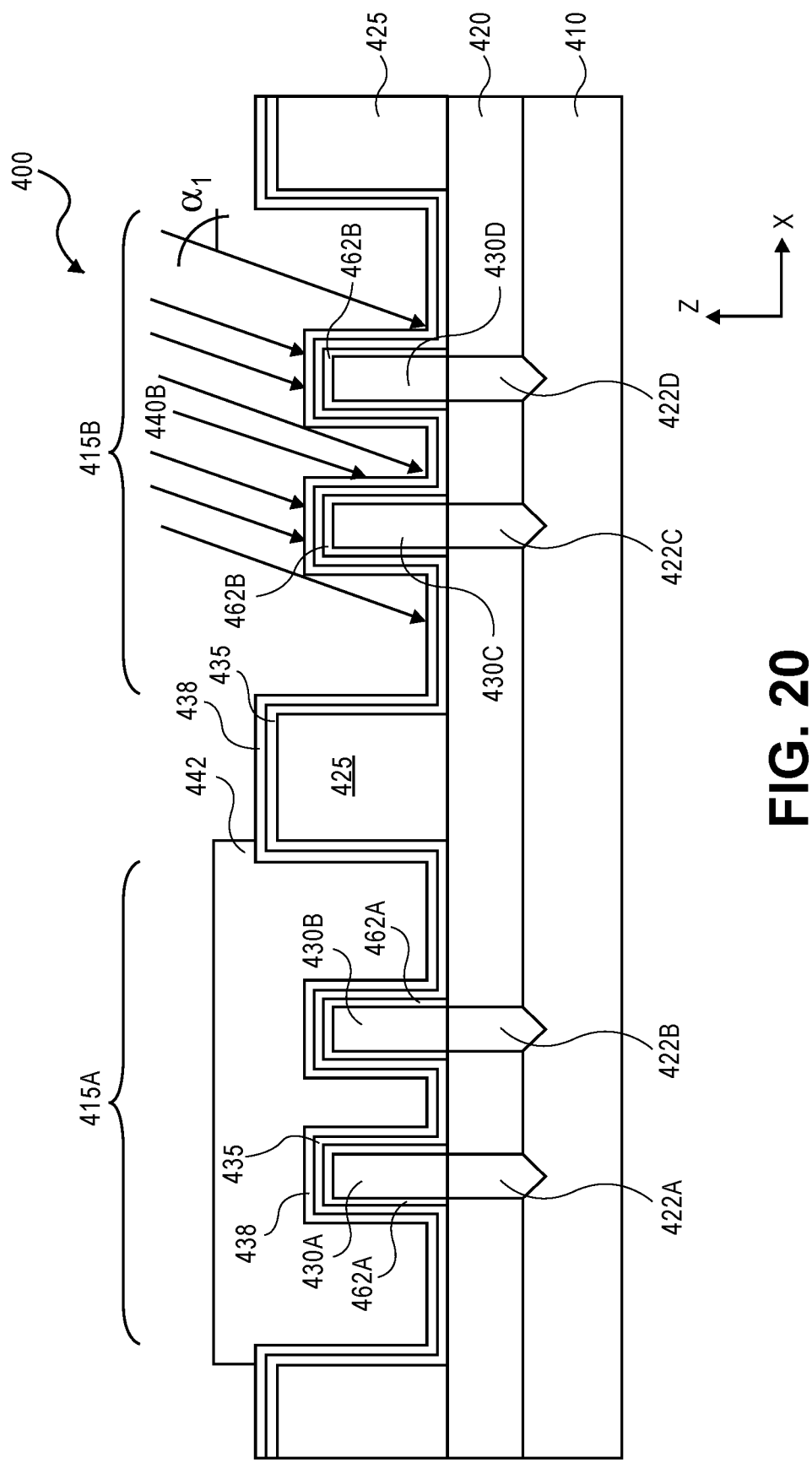
FIG. 20 shows the structure of FIG. 19 following the protection of one device area (a first device area) and showing an ion implantation into a second device area.

FIG. 19 shows structure 400 following a deposit of gate dielectric material on the fins in both device area 415A and device area 415B and the deposit of work function material across both device areas. In one embodiment, a material of gate dielectric is silicon dioxide or a high-k material(s) or a combination of silicon dioxide and a high-k material (s) that may be deposited on find 430A-430D to a thickness of a few nanometers by a CVD process (block 505, FIG. 25). Work function material 435 is then deposited conformally across both device areas 415A and 415B (block 510, FIG. 25). For an NMOS device, a suitable work function material is AlTiN. For a PMOS device, a representative work function material is TiN. Overlying work function material 435 is masking material 438, such as silicon or another material that may be modified by ion implantation and relatively easily removed (block 512, FIG. 25). A representative thickness of masking material 438 of silicon deposited by CVD is 20 nm FIG. 20 shows the structure of FIG. 19 following the protection of one device area and showing the ion implantation into a second device area (block 515, FIG. 25). FIG. 20 shows protection material 442 of, for example, a photoresist disposed on device area 415A. Protection material 442 may be formed by patterning techniques to protect device area 415A and leave device area 415B exposed. Once device area 415A is protected and device area 415B is exposed, device area 415B is exposed to an ion implant (block 520, FIG. 25). The ion implant is directed at device area 415B at an angle, $\alpha_1$, that is less than 90°. In one embodiment, it is desired that the implant modify 30 percent or more of masking material covering work function material on fins 430C and 430D (modify the masking material on the sidewalls and top of the fin). In one embodiment, angle, $\alpha_1$, is representatively on the order of 70 degrees.

Figure 21:
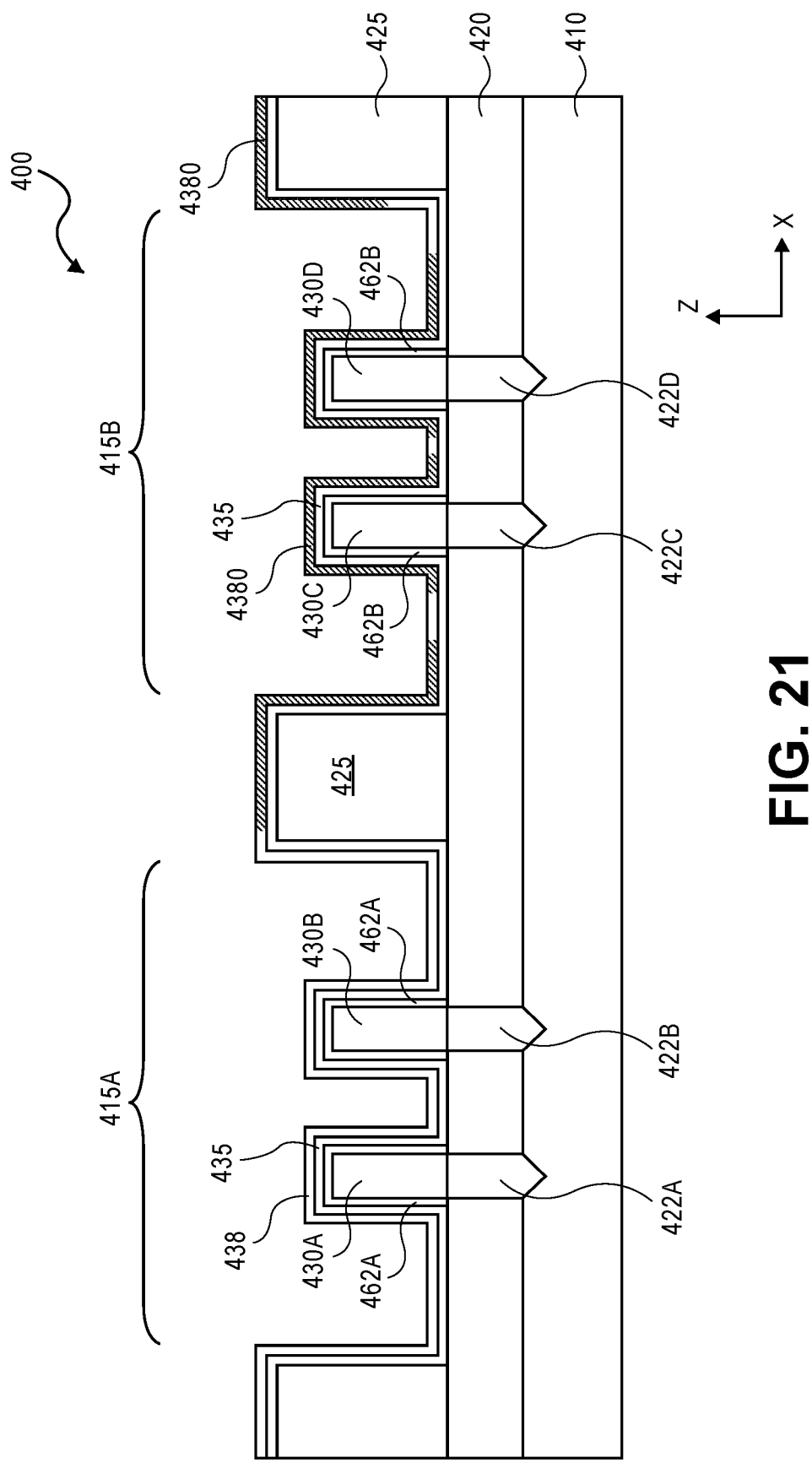
FIG. 21 shows the structure of FIG. 20 following the modification of a portion of the masking material in the second device area and the exposure of the first device area.

FIG. 21 shows the structure of FIG. 20 following the modification of a portion of the masking material in device area 415B and the exposure of device area 415A. As illustrated in FIG. 21, the ion implantation creates modified masking material 4380 on fins 430C and 430B and leaves unmodified masking material 438 in other areas.

Figure 22:
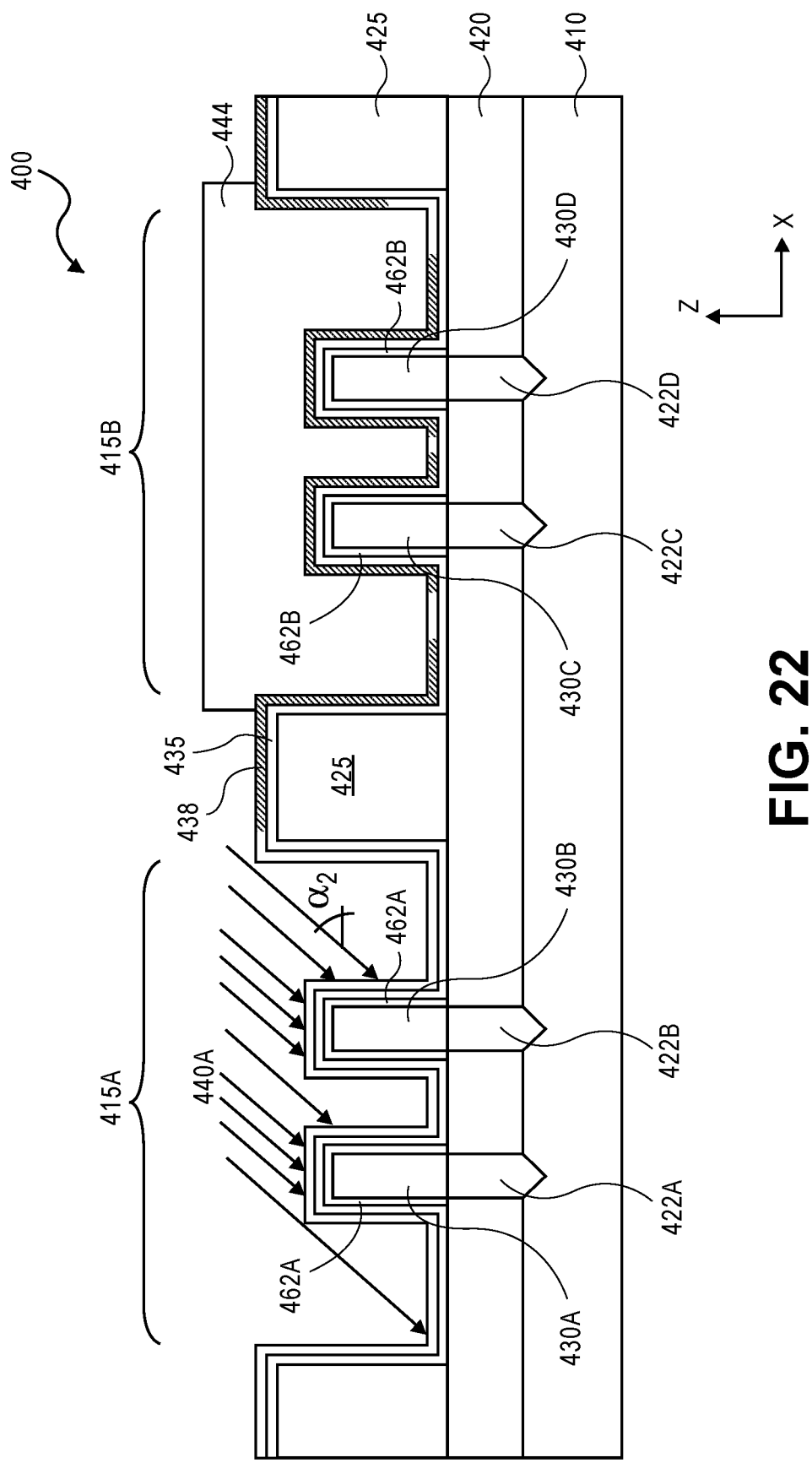
FIG. 22 shows the structure of FIG. 21 following the protection of the second device area and showing an ion implantation into the first device area.

FIG. 22 shows the structure of FIG. 21 following the masking of a second device area and shows ion implantation of an exposed device area. In this case, device area 415A is protected by masking material 444 that is, for example, a photoresist and device area 415A is exposed (block 525, FIG. 25). Protecting one device area and exposure of another may be formed by patterning techniques. FIG. 22 shows ion implantation 440A in device area 415A (block 530, FIG. 25). Ion implantation 440A, in this embodiment, is introduced to device area 415A at an angle, $\alpha_2$, that is less than angle, $\alpha_1$, used in the ion implantation of device area 415B (see FIG. 20, $\alpha_2<\alpha_1$). In one embodiment, it is desired to modify through ion implantation less than the entire portion of masking material on fins 430A and 430B (less than the entire masking material on the sidewalls and top of fins) and less than the portion of the masking material on fins 430C and 430D in device area 415B. A representative implantation angle, $\alpha_2$, is in the range of 45 degrees.

Figure 23:
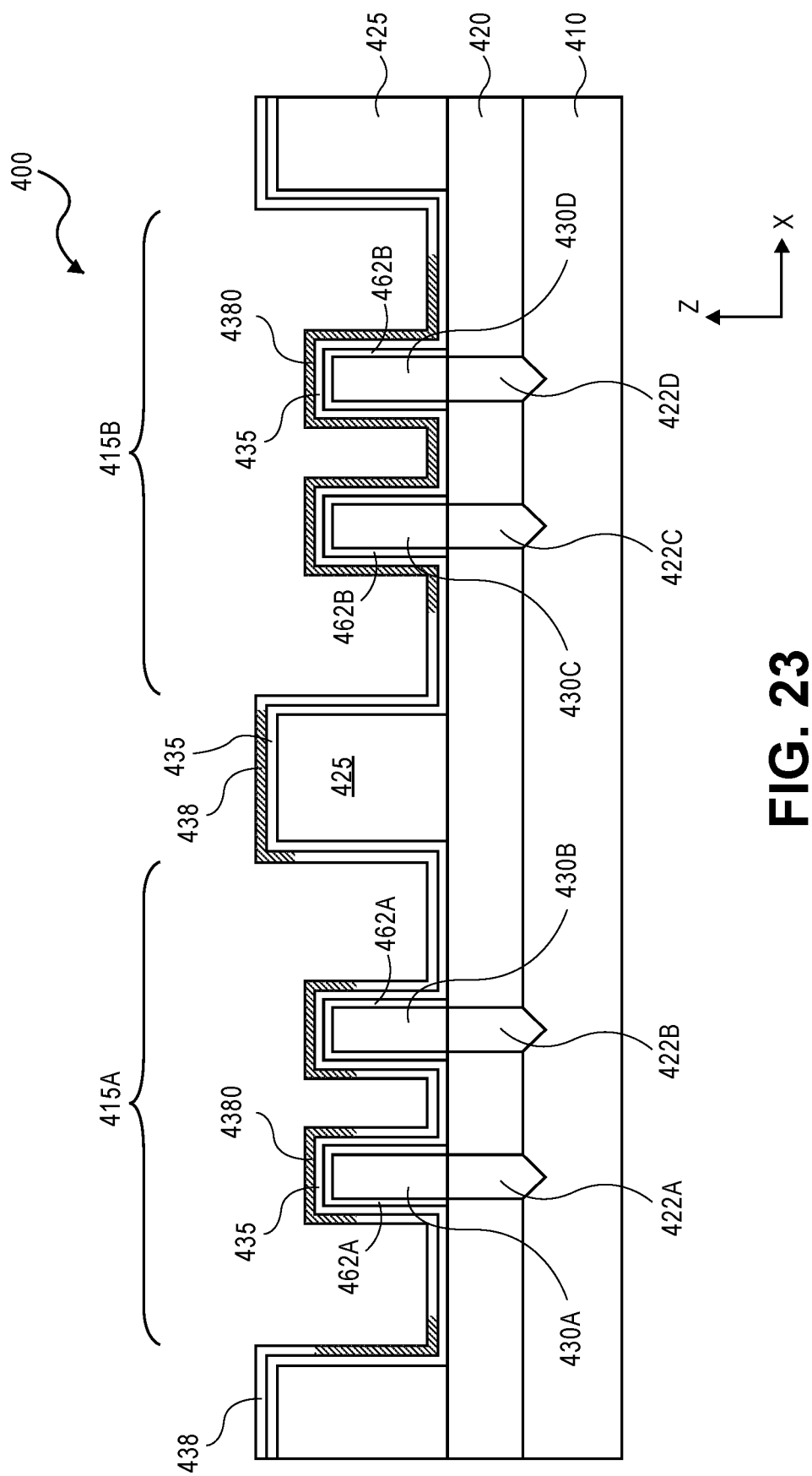
FIG. 23 shows the structure of FIG. 22 following the ion implantation of the device area and the removal of the masking material in the protected device area.

FIG. 23 shows the structure of FIG. 22 following the ion implantation of device area 415A and the removal of the masking material 444 in the protected device area. As illustrated, the ion implantation results in portions of modified masking material 4380 together with unmodified masking material 438 in device area 415A.

Figure 24:
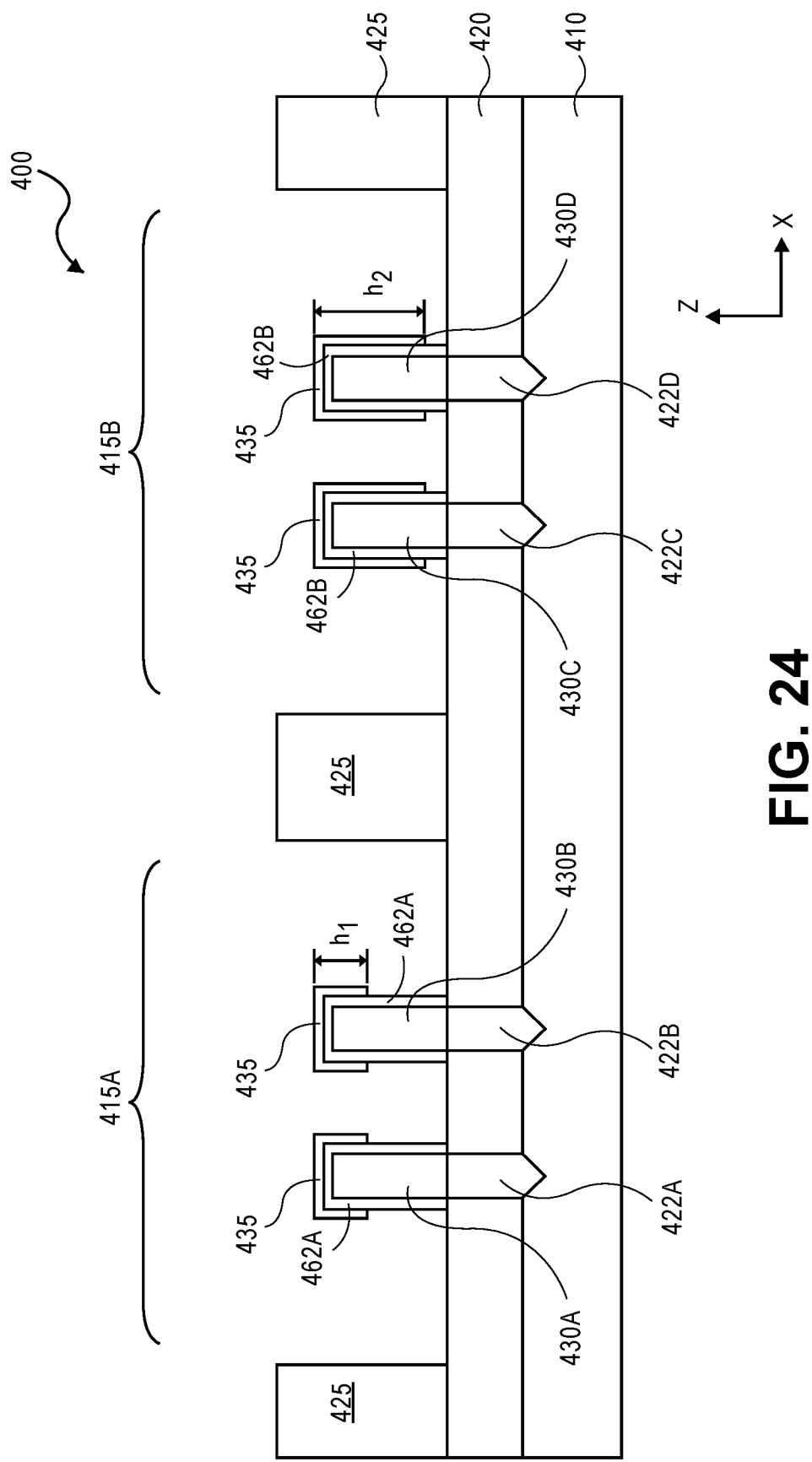
FIG. 24 shows the structure of FIG. 23 following a removal of the unmodified masking material and the subsequent removal of unprotected work function material and then the removal of modified masking material.
Figure 25:
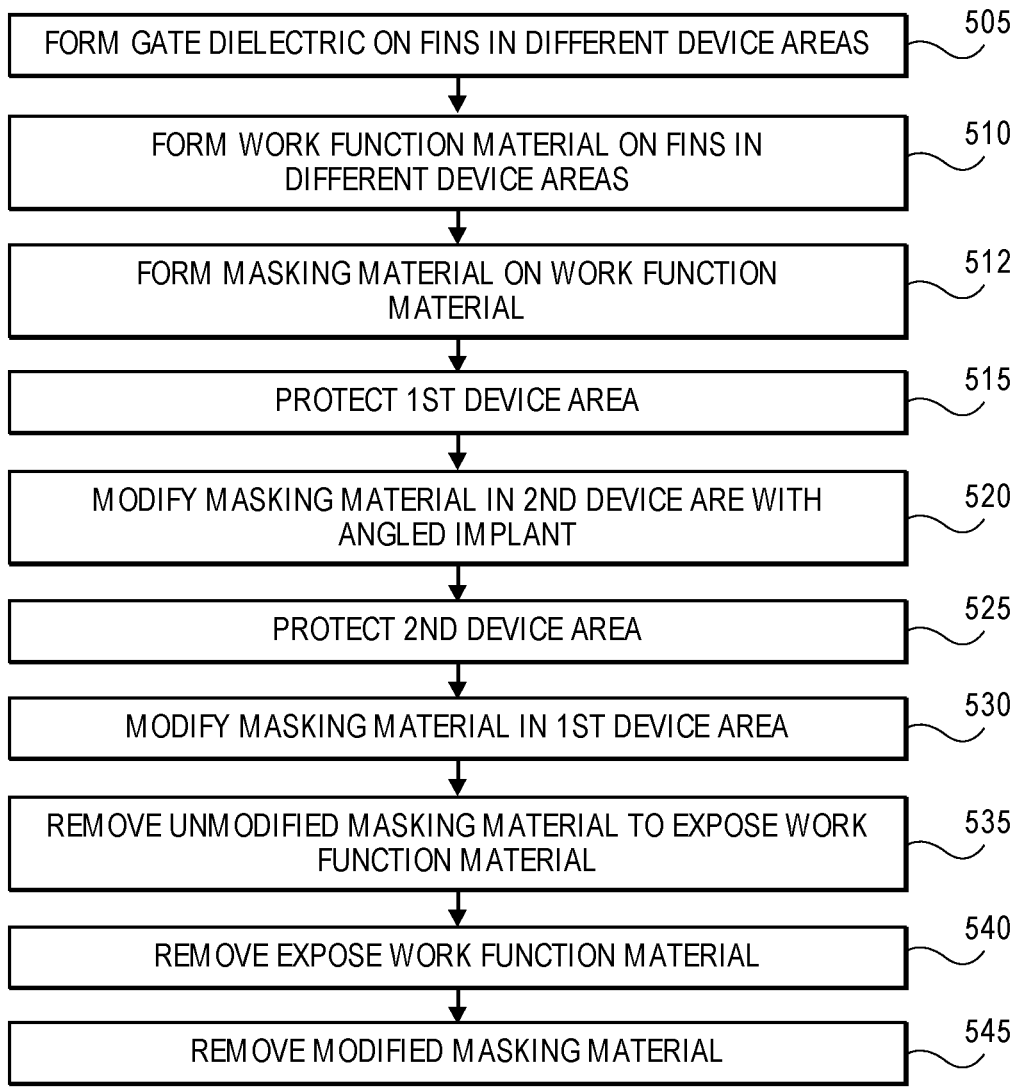
FIG. 25 presents a flow chart of the method described with reference to FIGS. 19-24.

FIG. 24 shows the structure of FIG. 23 following a removal of the unmodified masking material 438 of modified masking material and subsequent removal of unprotected work function material 435 and then the removal of modified masking material 4380. In one embodiment, the unmodified masking material (masking material 438) may be removed by wet clean (block 535, FIG. 25) followed by a subsequent wet clean to remove the exposed work function material 435, exposed the removal of masking material 438 (block 540, FIG. 25). Modified masking material 4380 (see FIG. 23) may then be removed by a third wet clean to leave the structure shown in FIG. 24 (block 545, FIG. 25). In FIG. 24, the amount of work function material on fins 430A and 430B is less than the amount of work function material on fins 430C and 430D. One measure of the amount of work function material is by the amount of work function material on the sidewalls of the fins. FIG. 24 shows work function material 435 having a height, $h_1$, on the sidewalls of fins 430A and 430B in device area 415A that is less than a height, $h_2$, on the sidewalls of fins 430C and 430D in device area 415B. The different amount of work function material on the fins will modify the voltage threshold of the devices formed therein. Transistor devices may be formed in device area 415A and device area 415B by following the process or method described above with reference to FIGS. 16 and 17 and the process flow of FIG. 18.

Figure 26:
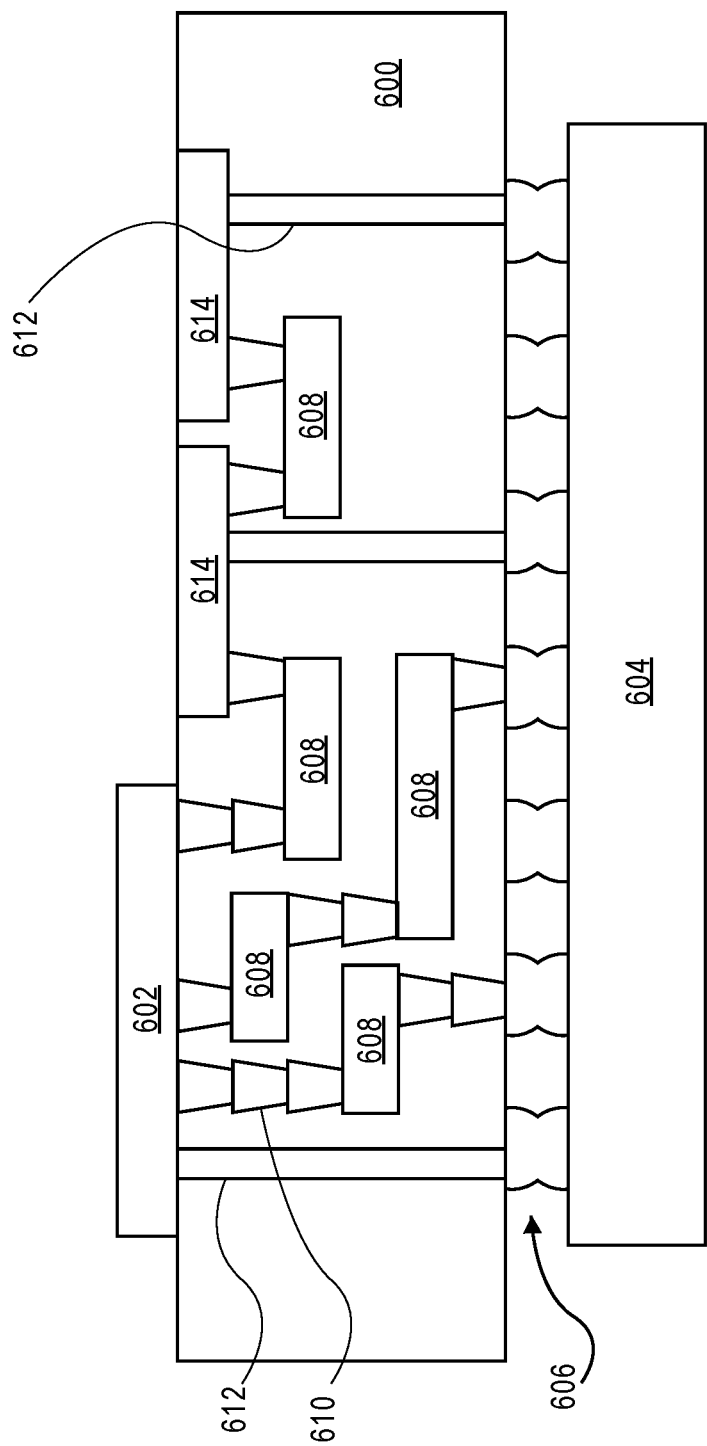
FIG. 26 is an interposer implementing one or more embodiments.

FIG. 26 illustrates interposer 600 that includes one or more embodiments. Interposer 500 is an intervening substrate used to bridge first substrate 602 to second substrate 604. First substrate 602 may be, for instance, an integrated circuit die including multigate transistor devices of the type described above. Second substrate 604 may be, for instance, a memory module, a computer motherboard, or another integrated circuit die. Generally, the purpose of interposer 600 is to spread a connection to a wider pitch or to reroute a connection to a different connection. For example, interposer 600 may connect an integrated circuit die to ball grid array (BGA) 606 that can subsequently be coupled to second substrate 604. In some embodiments, first and second substrates 602/604 are attached to opposing sides of interposer 600. In other embodiments, first and second substrates 602/604 are attached to the same side of interposer 600. In further embodiments, three or more substrates are interconnected by way of interposer 600.

Interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. Interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 600.

Figure 27:
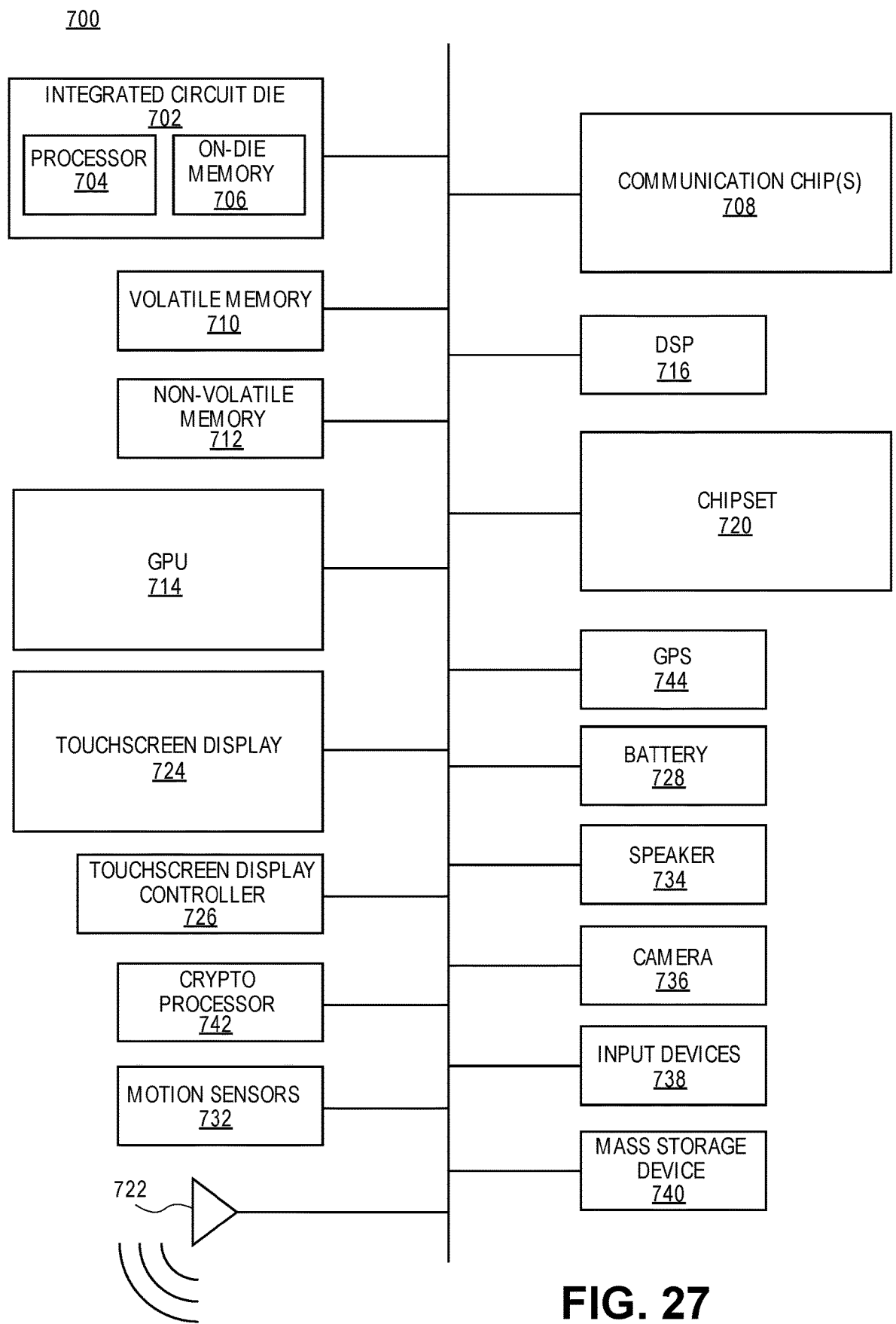
FIG. 27 illustrates an embodiment of a computing device.

FIG. 27 illustrates computing device 700 in accordance with one embodiment. Computing device 700 may include a number of components. In one embodiment, these components are attached to one or more motherboards. In an alternate embodiment, these components are fabricated onto a single system-on-a-chip (SoC) die rather than a motherboard. The components in computing device 700 include, but are not limited to, integrated circuit die 702 and at least one communication chip 708. In some implementations communication chip 708 is fabricated as part of integrated circuit die 702. Integrated circuit die 702 may include CPU 704 as well as on-die memory 706, often used as cache memory, that can be provided by technologies such as embedded DRAM (eDRAM) or spin-transfer torque memory (STTM or STTM-RAM).

Computing device 700 may include other components that may or may not be physically and electrically coupled to the motherboard or fabricated within an SoC die. These other components include, but are not limited to, volatile memory 710 (e.g., DRAM), non-volatile memory 712 (e.g., ROM or flash memory), graphics processing unit 714 (GPU), digital signal processor 716, crypto processor 742 (a specialized processor that executes cryptographic algorithms within hardware), chipset 720, antenna 722, display or touchscreen display 724, touchscreen controller 726, battery 728 or other power source, a power amplifier (not shown), global positioning system (GPS) device 744, compass 730, motion coprocessor or sensors 732 (that may include an accelerometer, a gyroscope, and a compass), speaker 734, camera 736, user input devices 738 (such as a keyboard, mouse, stylus, and touchpad), and mass storage device 740 (such as hard disk drive, compact disk (CD), digital versatile disk (DVD), and so forth).

Communications chip 708 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communication chips 708. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 704 of computing device 700 includes one or more devices, such as multigate transistors, that are formed in accordance with embodiments described above. The term "processor" may refer to any device or portion of a device that processes electronic data from registers and/or memory to transform that electronic data into other electronic data that may be stored in registers and/or memory.

Communication chip 708 may also include one or more devices, such as transistors, that are formed in accordance with embodiments.

In further embodiments, another component housed within computing device 700 may contain one or more devices, such as multigate transistors, that are formed in accordance with implementations.

In various embodiments, computing device 700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 700 may be any other electronic device that processes data.

EXAMPLES

The following examples pertain to embodiments:

Example 1 is an apparatus including at least one transistor in a first area of a substrate and at least one transistor in a different second area of the substrate, each of the at least one transistor in the first area and the second area including a transistor body, the transistor body including a height dimension and opposing sidewalls defining a width dimension; a work function material conformally on the width dimension and the sidewalls of a channel region of the at least one transistor body in each of the first area and the second area, wherein an amount of work function material on the sidewalls in a first area is different than an amount of work function material on the sidewalls in the second transistor area; and a first gate electrode on the channel region of the at least one transistor in the first area and a second gate electrode on the channel region of the at least one transistor in the second area.

In Example 2, the gate electrode on the at least one transistor body in the first area of the apparatus of Example 1 includes a first end cap distance from an edge of the at least one transistor body to an edge of the first area and the gate electrode on the at least one transistor body in the second area includes a second end cap distance from an edge of the at least one transistor body to an edge of the second area and wherein the second end cap distance is greater than the first end cap distance.

In Example 3, the at least one transistor body on the first area of the apparatus of Example 2 includes two transistor bodies separated by a first body distance and the at least one transistor body on the second area includes two transistor bodies separated by a second body distance, wherein the second body distance is greater than the first body distance.

Example 4 is a method including conformally depositing a work function material on at least one transistor body in a first transistor area and on at least one transistor body in a second transistor area of a substrate; conformally depositing a masking material on the work function material; selectively removing less than an entire portion of the masking material to expose the work function material on the at least one transistor body in each of the first area and the second area, wherein the portion of the work function material that is exposed on the at least one transistor body in the first area is different than the portion of the work function material that is exposed on the at least one transistor body in the second area; removing the exposed work function material from the at least one transistor body in each of the first transistor area and the second transistor area; removing the masking material; and forming a first gate electrode on the at least one transistor body in the first area and a second gate electrode on the at least one transistor body in the second area.

In Example 5, prior to selectively removing less than an entire portion of the masking material, the method of Example 4 includes modifying less than an entire portion of the masking material on the at least one transistor body in each of the first area and the second area and wherein selectively removing less than an entire portion of the masking material includes selectively removing the portion of the masking material that is not modified.

In Example 6, modifying less than an entire portion of the masking material of the method of Example 5 includes applying an implant to the masking material at a non-perpendicular angle relative to a surface of the substrate.

In Example 7, forming a gate electrode on the at least one transistor body in the first transistor area of the method of Example 6 includes forming the gate electrode with a first end cap distance from an edge of the at least one transistor body to an edge of the first transistor area and forming a gate electrode on the at least one transistor body in the second transistor area includes forming the gate electrode with a second end cap distance from an edge of the at least one transistor body to an edge of the second transistor area and wherein the second end cap distance is greater than the first end cap distance.

In Example 8, the non-perpendicular angle of the implant of the method of Example 7 is the same for the implant applied to the at least one transistor body of the first area and the at least one transistor body of the second area.

In Example 9, the at least one transistor body on the first area of the method of any of Examples 4-8 includes two transistor bodies separated by a first body distance and the at least one transistor body on the second area includes two transistor bodies separated by a second body distance, wherein the second body distance is greater than the first body distance.

In Example 10, modifying a portion of the masking material on the at least one transistor body in each of the first area and the second area of the method of Example 9 is performed sequentially.

In Example 11, prior to modifying a portion of the masking material on the at least one transistor body in the first area or the second area, the method of Example 10 includes masking the at least one transistor body in the other of the first area or the second area.

In Example 12, modifying a portion of the masking material of the method of Example 10 includes applying an implant to the masking material at a non-perpendicular angle relative to a surface of the substrate.

In Example 13, the non-perpendicular angle of the method of Example 12 is different for the implant applied to the at least one transistor body of the first area and the at least one transistor body of the second area.

In Example 14, the at least one transistor body in the first transistor area of the method of Example 4 includes at least two transistor bodies separated from one another by a first distance and the at least one transistor body in the second transistor area includes at least two transistor bodies separated from one another by a second distance and the first distance is different than the second distance.

In Example 15, an integrated circuit device formed by the method of any of Examples 4-14.

Example 16 is a method of forming transistors having different work functions, the method including forming at least one transistor body on a first area of a substrate; forming at least one transistor body on a second area of the substrate; conformally depositing a work function material on the at least one transistor body in each of the first transistor area and the second transistor area; conformally depositing a masking material on the work function material; modifying less than an entire portion of the masking material on the at least one transistor body in each of the first area and the second area, wherein the portion of the masking material that is modified on the at least one transistor body in the first area is different than the portion of the masking material that is modified on the at least one transistor body in the second area; and removing a portion of the masking material that is not modified and the work function material thereunder from the at least one transistor body in each of the first transistor area and the second transistor area; removing the modified masking material; and forming a first gate electrode on the at least one transistor body on the first area and a second gate electrode on the at least one transistor body on the second area.

In Example 17, modifying a portion of the masking material of the method of Example 16 includes applying an implant to the masking material at a non-perpendicular angle relative to a surface of the substrate.

In Example 18, forming a gate electrode on the at least one transistor body in the first transistor area of the method of Example 16 includes forming the gate electrode with a first end cap distance from an edge of the at least one transistor body to an edge of the first transistor area and forming a gate electrode on the at least one transistor body in the second transistor area includes forming the gate electrode with a second end cap distance from an edge of the at least one transistor body to an edge of the second transistor area and wherein the second end cap distance is greater than the first end cap distance.

In Example 19, the non-perpendicular angle of the implant of the method of any of Examples 16-18 is the same for the implant applied to the at least one transistor body of the first area and the at least one transistor body of the second area.

In Example 20, the at least one transistor body on the first area of the method of any of Examples 16-19 includes two transistor bodies separated by a first body distance and the at least one transistor body on the second area includes two transistor bodies separated by a second body distance, wherein the second body distance is greater than the first body distance.

In Example 21, modifying a portion of the masking material on the at least one transistor body in each of the first area and the second area of the method of any of Examples 16-20 is performed sequentially.

In Example 22, prior to modifying a portion of the masking material on the at least one transistor body in the first area or the second area, the method of any of Examples 16-21 includes masking the at least one transistor body in the other of the first area or the second area.

In Example 23, modifying a portion of the masking material of the method of Example 21 includes applying an implant to the masking material at a non-perpendicular angle relative to a surface of the substrate.

In Example 24, the non-perpendicular angle of the method of Example 23 is different for the implant applied to the at least one transistor body of the first area and the at least one transistor body of the second area.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
   a transistor in a first area of a substrate and a transistor in a different second area of the substrate, each transistor in the first area and the second area comprising a semiconductor body, each semiconductor body comprising a top and opposing sidewalls, the sidewalls extending above an isolation structure;
   a work function material directly on a gate dielectric layer conformally on the top and the sidewalls of a channel region of each semiconductor body in each of the first area and the second area, wherein the work function material on the sidewalls of the semiconductor body in the first area extends from the top and down along the sidewalls to a first height above the isolation structure, and wherein the work function material on the sidewalls of the semiconductor body in the second area extends from the top and down along the sidewalls to a second height above the isolation structure, the second height greater than the first height; and
   a first gate electrode over the work function material in the channel region of the transistor in the first area and a second gate electrode over the work function material in the channel region of the transistor in the second area, wherein the first gate electrode on the semiconductor body in the first area comprises a first end cap distance from an edge of the semiconductor body to an edge of the first area, wherein the second gate electrode on the semiconductor body in the second area comprises a second end cap distance from an edge of the semiconductor body to an edge of the second area, and wherein the second end cap distance is less than the first end cap distance.

2. The apparatus of claim 1, wherein the first area comprises a second semiconductor body separated by a first body distance from the semiconductor body of the first area, and the second area comprises a second semiconductor body separated by a second body distance from the semiconductor body of the second area, wherein the second body distance is less than the first body distance.

3. A method comprising:
conformally depositing a work function material on at least one semiconductor body in a first transistor area and on at least one semiconductor body in a second transistor area of a substrate;
conformally depositing a masking material on the work function material;
selectively removing less than an entire portion of the masking material to expose less than an entirety of the work function material on the at least one semiconductor body in each of the first area and the second area, wherein the portion of the work function material that is exposed on the at least one semiconductor body in the first area is different than the portion of the work function material that is exposed on the at least one semiconductor body in the second area;
removing the exposed work function material from the at least one semiconductor body in each of the first transistor area and the second transistor area;
removing the masking material; and
forming a first gate electrode on the at least one semiconductor body in the first area and a second gate electrode on the at least one semiconductor body in the second area, wherein the first gate electrode on the semiconductor body in the first area comprises a first end cap distance from an edge of the semiconductor body to an edge of the first area, wherein the second gate electrode on the semiconductor body in the second area comprises a second end cap distance from an edge of the semiconductor body to an edge of the second area, and wherein the second end cap distance is less than the first end cap distance.

4. The method of claim 3, wherein prior to selectively removing less than an entire portion of the masking material the method comprises modifying less than an entire portion of the masking material on the at least one semiconductor body in each of the first area and the second area and wherein selectively removing less than an entire portion of the masking material comprises selectively removing the portion of the masking material that is not modified.

5. The method of claim 4, wherein modifying less than an entire portion of the masking material comprises applying an implant to the masking material at a non-perpendicular angle relative to a surface of the substrate.

6. The method of claim 3, wherein the non-perpendicular angle of the implant is the same for the implant applied to the at least one semiconductor body of the first area and the at least one semiconductor body of the second area.

7. The method of claim 3, wherein the at least one semiconductor body on the first area comprises two transistor bodies separated by a first body distance and the at least one semiconductor body on the second area comprises two transistor bodies separated by a second body distance, wherein the second body distance is less than the first body distance.

8. The method of claim 7, wherein modifying a portion of the masking material on the at least one semiconductor body in each of the first area and the second area is performed sequentially.

9. The method of claim 8, wherein prior to modifying a portion of the masking material on the at least one semiconductor body in the first area or the second area, the method comprises masking the at least one semiconductor body in the other of the first area or the second area.

10. The method of claim 8, wherein modifying a portion of the masking material comprises applying an implant to the masking material at a non-perpendicular angle relative to a surface of the substrate.

11. The method of claim 10, wherein the non-perpendicular angle is different for the implant applied to the at least one semiconductor body of the first area and the at least one semiconductor body of the second area.

12. The method of claim 3, wherein the at least one semiconductor body in the first transistor area comprises at least two transistor bodies separated from one another by a first distance and the at least one semiconductor body in the second transistor area comprises at least two transistor bodies separated from one another by a second distance and the first distance is different than the second distance.

13. A method of forming transistors having different work functions, the method comprising:
forming at least one semiconductor body on a first area of a substrate;
forming at least one semiconductor body on a second area of the substrate;
conformally depositing a work function material on the at least one semiconductor body in each of the first transistor area and the second transistor area;
conformally depositing a masking material on the work function material;
modifying less than an entire portion of the masking material on the at least one semiconductor body in each of the first area and the second area, wherein the portion of the masking material that is modified on the at least one semiconductor body in the first area is different than the portion of the masking material that is modified on the at least one semiconductor body in the second area; and
removing a portion of the masking material that is not modified and the work function material thereunder from the at least one semiconductor body in each of the first transistor area and the second transistor area, wherein at least a portion of the work function material is retained in each of the first transistor area and the second transistor area;
removing the modified masking material; and
forming a first gate electrode on the at least one semiconductor body on the first area and a second gate electrode on the at least one semiconductor body on the second area, wherein the first gate electrode on the semiconductor body in the first area comprises a first end cap distance from an edge of the semiconductor body to an edge of the first area, wherein the second gate electrode on the semiconductor body in the second area comprises a second end cap distance from an edge of the semiconductor body to an edge of the second area, and wherein the second end cap distance is less than the first end cap distance.

14. The method of claim 13, wherein modifying a portion of the masking material comprises applying an implant to the masking material at a non-perpendicular angle relative to a surface of the substrate.

15. The method of claim 13, wherein the non-perpendicular angle of the implant is the same for the implant applied to the at least one semiconductor body of the first area and the at least one semiconductor body of the second area.

16. The method of claim 13, wherein the at least one semiconductor body on the first area comprises two transistor bodies separated by a first body distance and the at least one semiconductor body on the second area comprises two transistor bodies separated by a second body distance, wherein the second body distance is less than the first body distance.

17. The method of claim 13, wherein modifying a portion of the masking material on the at least one semiconductor body in each of the first area and the second area is performed sequentially.

18. The method of claim 17, wherein prior to modifying a portion of the masking material on the at least one semiconductor body in the first area or the second area, the method comprises masking the at least one semiconductor body in the other of the first area or the second area.

19. The method of claim 17, wherein modifying a portion of the masking material comprises applying an implant to the masking material at a non-perpendicular angle relative to a surface of the substrate.

20. The method of claim 19, wherein the non-perpendicular angle is different for the implant applied to the at least one semiconductor body of the first area and the at least one semiconductor body of the second area.

\* \* \* \* \*